United States Patent
Jones et al.

(10) Patent No.: US 6,843,422 B2
(45) Date of Patent: Jan. 18, 2005

(54) CONTACT SMART CARDS HAVING A DOCUMENT CORE, CONTACTLESS SMART CARDS INCLUDING MULTI-LAYERED STRUCTURE, PET-BASED IDENTIFICATION DOCUMENT, AND METHODS OF MAKING SAME

(75) Inventors: Robert Jones, Andover, MA (US); Joseph Anderson, Salem, NH (US); Daoshen Bi, Boxborough, MA (US); Thomas Regan, Seabrook, NH (US); Dennis Mailloux, Westminster, MA (US)

(73) Assignee: Digimarc Corporation, Tualatin, OR (US)

( * ) Notice: Subject to any disclaimer, the term of this patent is extended or adjusted under 35 U.S.C. 154(b) by 77 days.

(21) Appl. No.: 10/329,318

(22) Filed: Dec. 23, 2002

(65) Prior Publication Data

US 2003/0178495 A1 Sep. 25, 2003

Related U.S. Application Data

(60) Provisional application No. 60/344,673, filed on Dec. 24, 2001, provisional application No. 60/344,717, filed on Dec. 24, 2001, and provisional application No. 60/344,719, filed on Dec. 24, 2001.

(51) Int. Cl.[7] ............................................. G06K 19/06
(52) U.S. Cl. ...................................... 235/492; 235/380
(58) Field of Search ............................... 235/380, 492, 235/487

(56) References Cited

U.S. PATENT DOCUMENTS

| | | | |
|---|---|---|---|
| 5,171,625 A | | 12/1992 | Newton ....................... 428/195 |
| 5,304,513 A | * | 4/1994 | Haghiri-Tehrani et al. .. 156/245 |
| 5,380,695 A | | 1/1995 | Chiang et al. ............... 503/227 |
| 5,681,356 A | * | 10/1997 | Barak et al. ................ 29/25.01 |
| 5,721,781 A | | 2/1998 | Deo et al. ...................... 380/25 |

(List continued on next page.)

FOREIGN PATENT DOCUMENTS

WO    WO 03/005291    1/2003    ............ G06K/9/00

OTHER PUBLICATIONS

W. Rankl and W. Effing, "Smart Card Hand Book" 1997, John Wiley & Sons, pp. 35–40.*
PCT—Notification of Transmittal of the International Search Report or the Declaration, for International Application No. PCT/US02/41230, mailed on Jul. 28, 2003.
PCT—International Search Report for for International Application No. PCT/US02/41230, mailed on Jul. 28, 2003.

*Primary Examiner*—Mark Tremblay
(74) *Attorney, Agent, or Firm*—Digimarc Corporation

(57) ABSTRACT

The present invention relates to identification documents and smart cards. In one implementation, we provide a smart identification document including a document core. The document core is printed and laminated. The laminated core is milled to create a cavity. An integrated circuitry module is provided in the cavity. In one implementation, the cavity includes an upper cavity and a lower cavity. A laminate layer houses the upper cavity while the lower cavity extends into the document core. The upper cavity's aperture exceeds the aperture of the lower cavity resulting in a ledge in the laminate layer. A portion of the module may rest on the ledge, while another portion of the module may extend into the lower cavity. In another implementation, we provide a contactless smart card including a multi-layered structure. The structure includes a carrier layer including the smart card electronics. The carrier can be permeable (like a mesh or scrim) so that additional layers may be laminated into or through the carrier layer. A multi-layer structure provides a enhanced durability and helps protect the smart card electronics. In still another implementation, we provide a PET-based identification document. The PET-based document includes favorable durability and earth-friendly characteristics.

21 Claims, 21 Drawing Sheets

U.S. PATENT DOCUMENTS

| | | | | |
|---|---|---|---|---|
| 5,783,024 A | | 7/1998 | Forkert | 156/351 |
| 5,888,624 A | * | 3/1999 | Haghiri et al. | 428/195.1 |
| 5,955,961 A | | 9/1999 | Wallerstein | 340/825.33 |
| 6,000,607 A | | 12/1999 | Ohki et al. | 235/379 |
| 6,003,581 A | | 12/1999 | Aihara | 156/555 |
| 6,007,660 A | | 12/1999 | Forkert | 156/256 |
| 6,012,641 A | * | 1/2000 | Watada | 235/488 |
| 6,047,888 A | | 4/2000 | Dethloff | 235/380 |
| 6,066,594 A | | 5/2000 | Gunn et al. | 503/227 |
| 6,122,403 A | | 9/2000 | Rhoads | 382/233 |
| 6,159,327 A | | 12/2000 | Forkert | 156/264 |
| 6,199,144 B1 | | 3/2001 | Arora et al. | 711/145 |
| 6,202,932 B1 | | 3/2001 | Rapeli | 235/491 |
| 6,244,514 B1 | | 6/2001 | Otto | 235/492 |
| 6,247,644 B1 | | 6/2001 | Horne et al. | 235/380 |
| 6,250,554 B1 | * | 6/2001 | Leo et al. | 235/487 |
| 6,257,486 B1 | | 7/2001 | Teicher et al. | 235/380 |
| 6,283,188 B1 | | 9/2001 | Maynard et al. | 156/521 |
| 6,357,664 B1 | * | 3/2002 | Zercher | 235/488 |
| 6,390,375 B2 | * | 5/2002 | Kayanakis | 235/492 |
| 6,404,643 B1 | | 6/2002 | Chung | 361/7 |
| 6,424,029 B1 | | 7/2002 | Giesler | 257/679 |
| 6,485,319 B2 | | 11/2002 | Bricaud | 439/188 |
| 6,614,914 B1 | | 9/2003 | Rhoads et al. | 382/100 |

* cited by examiner

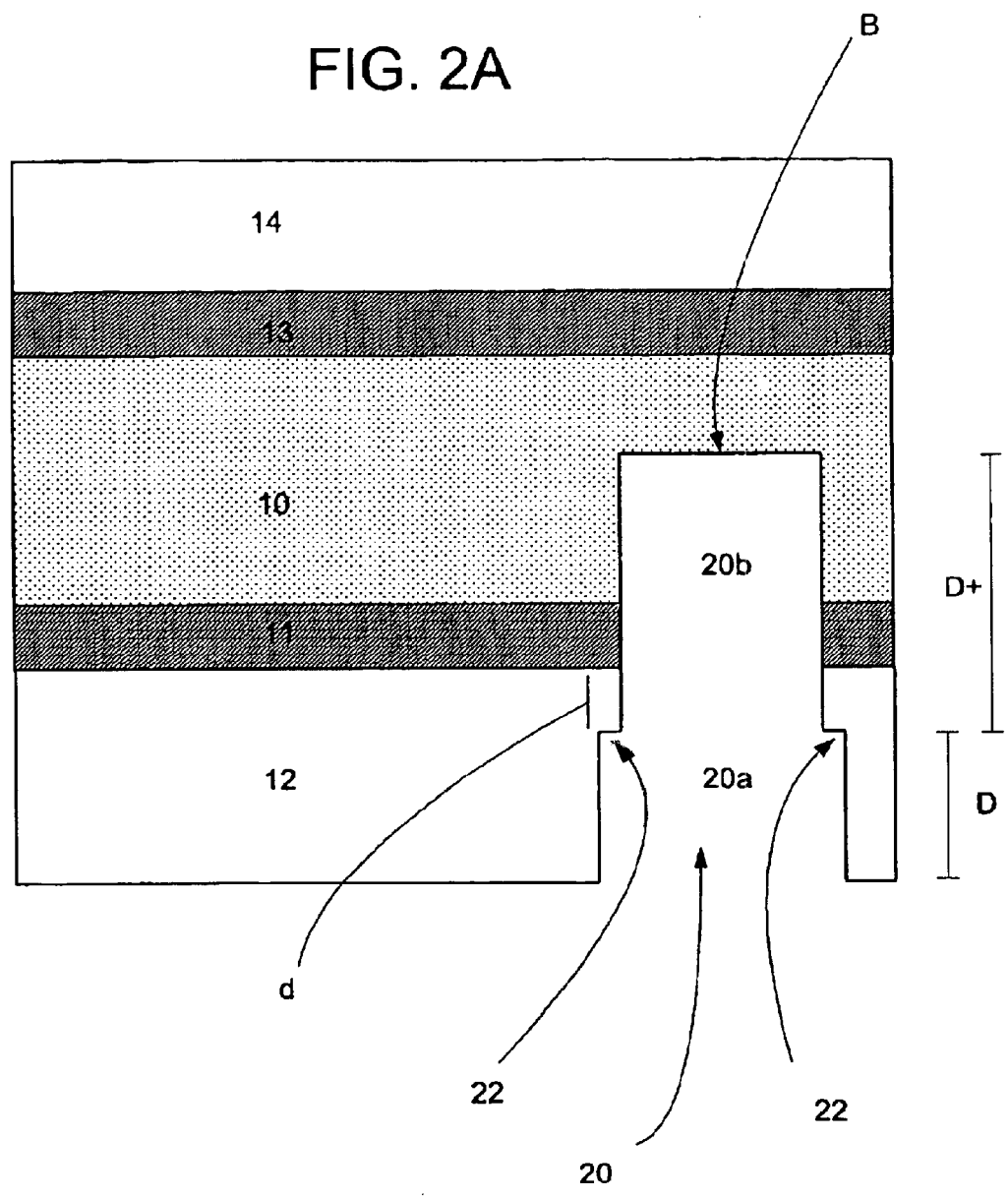

(Detail B)

(Detail C)

CONTACT SMART CARDS HAVING A DOCUMENT CORE, CONTACTLESS SMART CARDS INCLUDING MULTI-LAYERED STRUCTURE, PET-BASED IDENTIFICATION DOCUMENT, AND METHODS OF MAKING SAME

RELATED APPLICATION DATA

The present application claims the benefit of U.S. Provisional Patent Application Nos. 60/344,673, 60/344,717, and 60/344,719, each filed on Dec. 24, 2001. The present application is also related to U.S. patent application Ser. No. 09/969,200, filed Oct. 2, 2001. Each of the above U.S. patent documents is herein incorporated by reference.

TECHNICAL FIELD

The present invention relates generally to identification documents and smart cards.

BACKGROUND AND SUMMARY

Verifying one's true identify is an ever-increasing problem. Identify theft is rampant, and stolen identifies have even been used to facilitate terrorist attacks. Computer networks and secure areas have been breached with misappropriated keys, passwords and codes. Conventional solutions typically include a photo identification document having a photographic quality image of the license holder on the document protected from tampering by one or more security feature. Another solution is the use of so-called "smart cards."

The term "smart card" as used herein is defined broadly to generally include a device that carries information. (The definition of a smart card used in this application is broad enough to include so-called radio frequency identification cards—or RFID cards.). Typically, a smart card includes a microprocessor (or electronic processing circuitry) and/or memory circuitry embedded therein. The electronic circuitry is often packaged as a module. A memory smart card stores information in electronic memory circuits, while a processor smart card can manipulate information stored in associated memory. Of course a smart card module can include both processing and memory circuitry. A "contact" smart card communicates via a physical contact interface. A contact smart card is typically inserted into a smart card reader, thereby making physical contact between the interface and the reader. A "contactless" smart card may have an antenna through which signals are communicated, as shown in U.S. Pat. No. 6,424,029, which is herein incorporated by reference. Thus, a contactless smart card may not need a physical interface. Of course, a smart card can include both a contact and contactless (e.g., antenna and supporting circuitry) interface. A smart card may be passive in that it lacks an internal power source. Power can be supplied through its interface, which energizes the smart card's internal circuits. Of course, there are smart cards that may include an internal power source. Further background for smart cards and smart card readers can be found, e.g., in U.S. Pat. Nos. 5,721,781, 5,955,961, 6,000,607, 6,047,888, 6,193,163, 6,199,144, 6,202,932, 6,244,514, 6,247,644, 6,257,486, and 6,485,319.

Smart cards are capable of performing a variety of functions, including carrying data, manipulation or processing information and data, controlling access (e.g., by carrying pass codes, biometric data, passwords, etc.), providing identifying information, holding biometric data, etc. Of course, this is not an exhaustive list of possible smart card functionality.

A conventional smart card manufacturing process provides a blank card. The blank is drilled, perhaps by a second vendor or manufacturer. A smart card chip is inserted into a pre-drilled blank. (U.S. Pat. No. 6,404,643, herein incorporated by reference, discloses a card with an integrated circuit. The integrated circuit is attached to a card blank and is bonded by melt flowing adhesive. The card blank can have a pre-drilled cavity into which the integrated circuit is placed, or may be the same size and shape as is the card blank and a space there between is filled with adhesive.) Often times the chip filled blank is passed to a third vendor or manufacturer who prints or engraves the chip filled blank. The printing processes available at this stage are sometimes limited. In fact, printing is not always possible on both sides of the card—due to the contact area presented by a smart card module. Even if a smart card is printed after embedding an integrated circuit module, the printing may nevertheless be vulnerable to malicious attacks (e.g., by changing information printed on the smart card).

We have found additional limitations that are associated with conventional smart cards. In the case of contact smart cards, some of these problems include the smart card module popping off the card when flexed, flex stresses that damage the smart card module, and/or the card itself cracking with normal wear and tear.

Accordingly, in one embodiment of the present invention, we provide a contact smart card including a core layer. The core layer can include a synthetic paper—offering flexibility for the contact smart card. Thus, the synthetic paper core may also help to reduce cracking often seen after normal wear and tear of conventional smart cards. The core layer is preferably preprinted, perhaps with personal information, prior to the insertion of a smart card module. We can print high quality images and text—on both sides of the document, if needed—since the smart card module is installed after printing. The print is preferably covered with a laminate to offer intrusion protection and wear-and-tear protection. A cavity is formed in the laminated structure and integrated circuitry is secured in the cavity.

Some of our smart card processes can also be controlled by one entity, if desired, such as in a "central" issue (CI) program. Commercial systems for issuing ID documents are of two main types, namely so-called "central" issue (CI), and so-called "on-the-spot" or "over-the-counter" (OTC) issue. Of course, we envision that we will provide so-called "blank" documents (e.g., document structures without printing and lamination, or with some pre-printing and/or some lamination) to over-the-counter (OTC) issuing stations.

Central issue type ID documents are not immediately provided to the bearer, but are later issued to the bearer from a central location. For example, in one type of CI environment, a bearer reports to a document station where data is collected, the data is forwarded to a central location where the card is produced, and the card is forwarded to the bearer, often by mail. Another illustrative example of a CI assembling process occurs in a setting where a driver passes a driving test, but then receives her license in the mail from a CI facility a short time later. Still another illustrative example of a CI assembling process occurs in a setting where a driver renews her license by mail or over the Internet, then receives a drivers license through the mail.

Centrally issued identification documents can be produced from digitally stored information and generally comprise a core material (also referred to as "substrate"), such as paper or plastic, sandwiched between a plurality of layers of, e.g., clear plastic laminate, such as polyester or polycarbonate, to protect printed information (e.g., photographs, text, barcodes, biometric representations, security features, etc.) from wear, exposure to the elements and tampering. The materials used in such CI identification documents can offer the ultimate in durability. In addition, centrally issued digital identification documents generally offer a higher level of security than OTC identification documents because they offer the ability to pre-print the core of the central issue document with security features such as "micro-printing", ultra-violet security features, security indicia and other features currently unique to centrally issued identification documents. Another security advantage with centrally issued documents is that the security features and/or secured materials used to make those features are centrally located, reducing the chances of loss, misappropriation or theft (as compared to having secured materials dispersed over a wide number of "on the spot" locations).

In addition, a CI assembling process can be more of a bulk process facility, in which many cards are produced in a centralized facility, one after another. The CI facility may, for example, process thousands of cards in a continuous manner. Because the processing occurs in bulk, CI can have an increase in efficiency as compared to some OTC processes, especially those OTC processes that run intermittently. Thus, CI processes can sometimes have a lower cost per ID document, if a large volume of ID documents is manufactured.

In contrast to CI identification documents, over-the-counter ("OTC") identification documents are issued immediately to a bearer who is present at a document-issuing station. An OTC assembling process provides an ID document "on-the-spot." (An illustrative example of an OTC assembling process is a Department of Motor Vehicles ("DMV") setting where a driver's license is issued to a person, on the spot, after a successful exam.). In some instances, the very nature of the OTC assembling process results in small, sometimes compact, printing and card assemblers for printing the ID document.

In identification and security applications, it is often desirable to increase the functionality of identification documents. Accordingly, one aspect of the present invention may provide the look and/or feel of conventional identification documents while providing smart card functionality. In one implementation, we combine an image bearing identification card with smart card functionality. We sometimes refer to these type of documents as "smart identification documents." In another implementation, we "upgrade" an identification document that may have already passed into circulation by providing a smart card module within a pre-circulated ID document.

Another aspect of the present invention involves modification of a synthetic paper core-based identification (ID) document to provide a smart card that includes integrated circuitry (e.g., a semiconductor chip and interface), laser, thermal transfer and/or offset printed images (e.g., including photographic representations) and/or customized (or personalized) text and data.

(In this document, the use of the terms "identification document" and "ID document" is intended to include at least all types of ID documents. Note that, for the purposes of this disclosure, the terms "document," "card," "badge" and "documentation" are used interchangeably. In addition, ID documents are broadly defined herein and include (but are not limited to), documents, magnetic disks, credit cards, bank cards, phone cards, passports, driver's licenses, network access cards, employee badges, debit cards, security cards, visas, immigration documentation, national ID cards, citizenship cards, social security cards and badges, certificates, identification cards or documents, voter registration cards, police ID cards, border crossing cards, security clearance badges and cards, gun permits, badges, gift certificates or cards, membership cards or badges, tags, CD's, consumer products, knobs, keyboards, electronic components, etc., or any other suitable items or articles that may record information, images, and/or other data, which may be associated with a function and/or an object or other entity to be identified.).

In addition, in this document, "identification" includes (but is not limited to) information, decoration, and any other purpose for which an indicia can be placed upon an article in the article's raw, partially prepared, or final state. Also, instead of ID documents, our inventive techniques can be employed with product tags, product packaging, business cards, bags, charts, maps, labels, etc., etc., particularly those items including an laminate or over-laminate structure. The term ID document thus is broadly defined herein to include these tags, labels, packaging, cards, etc.

According to another aspect of the present invention, a smart identification document includes: a core layer including a first surface and a second surface; a first layer of a substantially transparent polymer adjacently arranged on the first surface of the core layer; an aperture; and a module. The aperture includes a first section disposed in the first polymer layer, the first section including a ledge in the first polymer layer, and a second section disposed in at least the core layer. The module includes electronic circuitry, wherein at least a first portion of the module is adjacently arranged with the ledge, and at least a section portion of the module extends into at least some of the second section of the aperture.

According to still another aspect of the present invention, an identification document includes a core layer including a front side and a back side; printed indicia formed on at least the front side of the core layer; a first laminate layer secured with an adhesive to the back side of the core layer; a second laminate layer secured with an adhesive to the front side of the core layer; a cavity disposed in the first laminate, the cavity extending through the first laminate layer, adhesive and into the core layer; and electronic circuitry disposed in the cavity.

According to yet another aspect of the invention, a manufacturing method includes the steps of: providing a first laminate and a second laminate, the first laminate comprising a front surface and a back surface, and the second laminate comprising a front surface and a back surface; adjacently arranging an adhesive with the back surface of the first laminate; adjacently arranging an adhesive with the back surface of the second laminate; providing a core having a top surface and a bottom surface; laminating the first laminate, adhesive, core, adhesive and second laminate to form a structure; machining a portion of the structure; and providing an integrated circuitry module in the machined portion of the structure, the integrated circuitry module providing at least some smart card functionality.

Still another aspect of the present invention relates to a milling tool for milling a polymer and a synthetic paper structure to receive a smart card module. The tool includes: a fluted shaft having a first section and a second section; a first cutting edge having a first bevel disposed on the first section; a second cutting edge having a second bevel disposed on the second section, the first and second cutting edges forming a first axis; and wherein a non-cutting end of the first bevel and a non-cutting end the second bevel form a second axis which is rotated at a first angle in a range of 15–60 degrees from the first axis.

Yet another aspect of the present invention relates to a method of milling a cavity in an identification document to receive a smart card module. The identification document includes at least a laminate layer—document core structure. The method includes providing a first cut in the laminate layer to create a rough upper cavity, the rough upper cavity including a first aperture; providing a second cut to create a lower cavity, the lower cavity extending through the laminate layer into the document core, the lower cavity and the rough upper cavity being approximately centered around a common axis, wherein the aperture of the lower cavity is relatively smaller than the aperture of the rough upper cavity resulting in a shelf in the laminate layer; and providing a third cut around the rough upper cavity to create a finished upper cavity, the finished upper cavity having an aperture which is larger than the aperture of the rough upper cavity, the finished upper cavity being approximately centered around the common axis.

Still another aspect of the present invention includes an identification document including: a first PET (polyethylene terephthalate) film including a top surface and a bottom surface; a second PET film including a top surface and a bottom surface; an image-receiving layer provided on the first PET film top surface; and an adhesive layer in contact with the first PET film bottom surface and the second PET film top surface, the adhesive serving to secure the first PET film and the second PET film to one another.

Still another aspect of the present invention provides a method of making a contactless smart identification document. The method includes: providing a carrier layer including at least an antenna and electronic circuitry, wherein the carrier comprises at least one permeable area; arranging the carrier layer between a first contact layer and a second contact layer, and then securing the first contact layer and second contact layer to the carrier layer through at least one of heat and pressure so that at least a portion of one of the first contact layer and the second contact layer migrates into the carrier layer at the one permeable area; and providing first and second laminate layers over at least the first and second contact layers, respectively.

Further aspects, features and advantages of the present invention will become even more apparent with reference the following detailed description and the accompanying drawings.

BRIEF DESCRIPTION OF THE DRAWINGS

FIG. 2A is a cross-sectional view of the FIG. 1 document including a cavity provided therein to receive a smart card module (e.g., a contact-type smart card module).

Of course, the drawings are not necessarily presented to scale, with emphasis rather being placed upon illustrating the principles of the invention. In the drawings, like reference numbers indicate like elements.

DETAILED DESCRIPTION OF THE INVENTION

The Detailed Description is divided into three sections for the reader's convenience (e.g., "Contact Smart Cards Including a Document Core," "Contactless Smart Cards Including Multi-layered Structure," and "Manufacture of PET-Based Identification Document"). It should be appreciated, however, that elements and functionality disclosed in one section can be readily combined with elements and functionality found in another section. Therefore, the section headings should not be interpreted as limiting the scope of the present invention.

Section 1: Contact Smart Cards Including a Document Core

For purposes of illustration, the following section will generally proceed with reference to contact-type smart cards (which are sometimes interchangeably referred to as a "contact smart ID document" or a "smart ID document"). A preferred contact-type smart ID document includes a multi-layered ID document including a document core and fused or secured polymer laminates. The multi-layered ID document is provided with integrated circuitry to facilitate processing and/or memory storage. It should be appreciated, however, that the present invention is not so limited. Indeed, as those skilled in the art will appreciate, the inventive techniques can be applied to many other structures formed in many different ways. For example, contactless smart card modules can be suitably packaged, with such packages being disposed in a cavity created in a multi-layered document structure.

Figure 1:
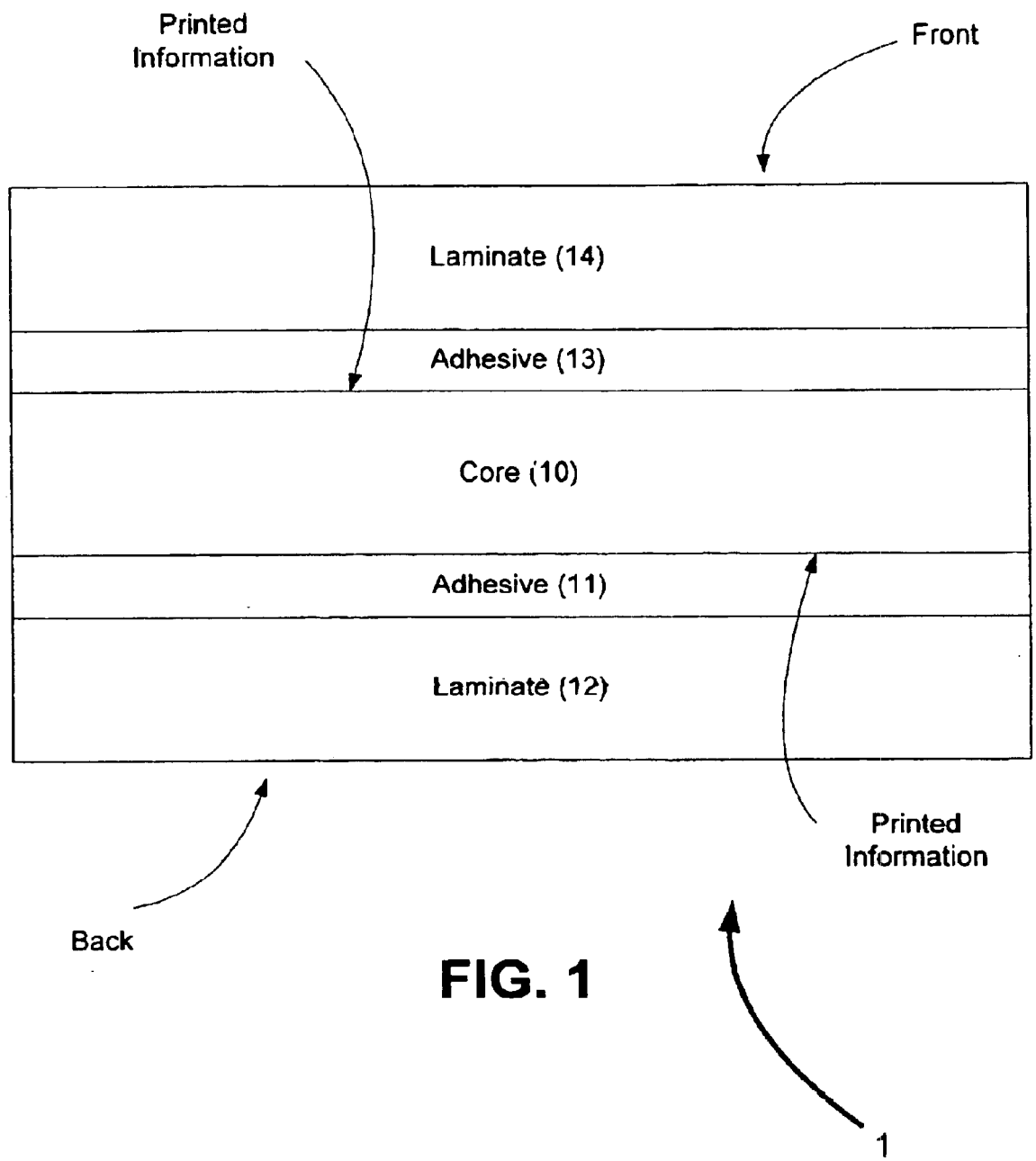
FIG. 1 is a cross sectional view of an identification document including a document core.

FIG. 1 is a cross-sectional view of an identification document 1 according to one aspect of the present invention. The identification (ID) document 1 is used as the foundation for a smart ID document. The ID document 1 preferably includes a core 10, and a generally transparent laminate 12. The ID document will typically include a second laminate layer 14. Adhesive 11 and 13 is preferably used to help adhere the laminate layers 12 and 14 to the core 10. (Instead of separate adhesive layers 11 and 13, the laminate 12 may be coated with an adhesive or may include adhesive materials.) If indicia (e.g., printed text, images, machine readable code, etc.) is provided on the core or laminate surface(s), the adhesive 11 and 13 is preferably transparent. A laminate structure can be cut to meet the dimensions specified for a particular identification document, if needed.

Indicia (interchangeably used with "information") can be provided (e.g., screen printed, offset printed, gravure printed, thermal transferred, provided via ink or laser jet printing, laser engraved, etc.) on the front and/or back surface of the core 10 or laminate 14/adhesive 13 prior to lamination. For example, the information may include variable information, which is information that is unique to a cardholder (e.g., name, birth date, age, sex, weight, address, biometric information, photograph, and/or signature, etc.). The information may also include so-called "fixed" information. Fixed information is generally thought of as that information which remains constant from card to card, such as issuing agency information, seal, and/or some types of security designs, etc. Additional information, e.g., optical variable devices, can be provided on the core 10, adhesive 11 and 13, or laminate layers 12 and 14. (Reference may be had to assignee's U.S. patent application Ser. No. 09/969,200, filed Oct. 2, 2001, for even further information regarding optical variable inks and devices. This application is herein incorporated by reference.). Other security features that may be optionally presented on the smart identification document include, e.g., ghost images, microprinting, ultraviolet or infrared images, biometric information, etc. We can optionally provide a print receiver (e.g., an image-receiving layer) to help a core or laminate layer better receive printed or transferred information. (For example, see the D2T2 receivers discussed in the present patent document and in U.S. Pat. No. 6,066,594, which patent is herein incorporated by reference.).

Printed or engraved information may optionally include a so-called digital watermark. Digital watermarking is a process for modifying physical or electronic media to embed machine-readable indicia (or code) into the media. The media may be modified such that the embedded code is imperceptible or nearly imperceptible to the user, yet may be detected through an automated detection process. In some embodiments, the printed or engraved information identification document includes two or more digital watermarks. In other embodiments, a digital watermark is "fragile" in that it is designed to degrade or be lost upon copying and/or reproducing.

Digital watermarking systems typically have two primary components: an encoder that embeds the digital watermark in host media, and a decoder that detects and reads the embedded digital watermark from a signal suspected of containing a digital watermark. The encoder embeds a digital watermark by altering the host media signal. (E.g., the encoder can make slight alterations to a graphic, background pattern or photograph that is to be printed on an identification document. The alterations may be to pixel values, DCT coefficients corresponding to the host media signal, transform domain representations of the host media signals, etc., etc.). The reading component analyzes a suspect signal to detect whether a digital watermark is present. In applications where the digital watermark encodes information (e.g., as a payload or message bits), the reader extracts this information from the detected digital watermark. The reading component can be hosted on a wide variety of tethered or wireless reader devices, from conventional PC-connected cameras and computers to fully mobile readers with built-in displays, etc. By imaging a watermarked surface of an identification document, the watermark information can be read and decoded by a reader.

Several particular digital watermarking techniques have been developed. The reader is presumed to be familiar with the literature in this field. Some techniques for embedding and detecting imperceptible watermarks in media signals are detailed in the assignee's co-pending U.S. patent application Ser. No. 09/503,881, U.S. Pat. No. 6,122,403 and PCT patent application PCT/US02/20832, which are each herein incorporated by reference.

(Material types are now provided by way of example only. Of course, there are many other materials that may be suitably interchanged with some aspects of the present invention. Returning to FIG. 1, the core 10 material can include a synthetic such as TESLIN, other synthetic materials, polymer, composite, and/or polyolefin, etc. TESLIN is a synthetic paper sold by PPG Industries, Inc., One PPG Place, Pittsburgh, Pa. 15272 USA. TESLIN can be provided in sheets, with multiple cores taken from each TESLIN sheet. The laminate (sometimes called an "over laminate") may include (but is not limited to) film and sheet products. Laminates usable with at least some embodiments of the invention include those which contain substantially transparent polymers and/or substantially transparent adhesives, or which have substantially transparent polymers and/or substantially transparent adhesives as a part of their structure, e.g., as an extruded feature. In some of the embodiments of the present invention, the term "laminate" may include both the laminate and adhesive layers (e.g., layers 12 and 11), e.g., in FIGS. 1–2C. Examples of usable laminates include at least polyester, polycarbonate, polystyrene, cellulose ester, polyolefin, polysulfone, or polyamide, etc. Laminates can be made using either an amorphous or biaxially oriented polymer as well. A laminate can comprise a plurality of separate laminate layers, for example a boundary layer and/or a film layer. Our most preferred laminate, however, is a polycarbonate. Various lamination processes are disclosed in assignee's U.S. Pat. Nos. 5,783,024, 6,007,660, 6,066,594, and 6,159,327. Other lamination processes are disclosed, e.g., in U.S. Pat. Nos. 6,283,188 and 6,003,581. Each of these U.S. Patents is herein incorporated by reference.)

(The degree of transparency of a laminate can, for example, be dictated by the information contained on the core layer, the particular colors and/or security features used, etc. The thickness of the laminate layers is not critical, although in some embodiments it may be preferred that the thickness of a laminate layer be about 1–20 mils (where 1 mil is about 25 $\mu$m). Lamination of any laminate layer(s) to any other layer of material (e.g., a core layer) can be accomplished using a conventional lamination process, and such processes are well known to those skilled in the production of articles such as identification documents. Of course, the types and structures of the laminates described herein are provided only by way of example, those skilled in the art will appreciated that many different types of laminates are usable in accordance with the invention. The material(s) from which a laminate is made may be transparent, but need not be. Laminates also includes security laminates, such as a transparent laminate material with proprietary security technology features and processes, which protects documents of value from counterfeiting, data alteration, photo substitution, duplication (including color photocopying), and simulation by use of materials and technologies that are commonly available. Laminates also can include thermosetting materials, such as epoxy.). Suitable laminate materials can be readily obtained, e.g., from GE Plastics, headquartered in Pittsfield, Mass. USA. Laminates can be even provided in roll form, e.g., 1000 ft/roll (e.g., about 21 cards/ft).)

(One adhesive material (e.g., layers 11 and 13 in FIG. 1) can include, e.g., KRTY as provided by Transilwrap, headquartered in Franklin Park, Ill. 60131 USA. The adhesive may also be provided as a laminate layer or coated onto the laminate or laminate rolls. Other adhesives usable in accordance with some embodiments of the invention include polyester, polyester urethane, polyether urethane, polyolefin, and/or hot melt or ultraviolet or thermally cured adhesive, thermoplastics, etc. The multi-layered structure is formed during a lamination process, in which adjustments to the processing time, temperature and pressure can be varied to optimize lamination.)

Dimensions of an ID document will vary according to specified design requirements. For example, applicable International Organization for Standardization (ISO) specifications for identification documents may specify required dimensions. Within specified dimensions there is some dimension play. In one implementation, we provide a core including an 4–20 mil depth, adhesives with a 2–7 mil depth, and laminate layers ranging from 3–15 mils. Our most preferred implementation provides a 12 mil back laminate, a 2 mil back adhesive, a 12 mil core, a 2 mil front adhesive and a 5 mil front laminate.

In some implementations we provide a matte finish on a top surface of the back laminate layer. The matte finish helps to feed the laminate layer if provided in roll form. The matte finish may also provide a tactile security feature, as an inspector can feel the texture of the card (e.g., a matted finish) to determine if the card is legitimate.

With reference to FIG. 2A, a cavity or well 20 is provided (e.g., machined, milled, cut or laser etched, etc.) in the FIG. 1 ID document 1. We interchangeably use the terms "cavity" and "well" in this document. The well 20 provides a housing or receptacle for a smart card integrated circuit module (hereafter sometimes referred to a "module" or as "smart card module"). The shape and dimensions of the well 20 will vary according to the shape and dimensions of a selected smart card module that is to be inserted into the well 20. For discussion purposes we have chosen to illustrate the present invention with respect to the Hitachi AE 45C smart card chip module, as provided by Hitachi, located in Maidenhead, Berkshire, UK, and which provides 32K bytes of memory. A multi-application chip operating system, e.g., MULTOS or any other suitable chip operating system, can be used to control the operation of the smart card module. MULTOS can be obtained, e.g., through Moasco, Ltd in London, England. (We note that dimensions of the Hitachi AE 45C module are analogous to the Atmel 1608 Module, which, like other smart card modules, can be suitably interchanged with the Hitachi AE 45C module.). Our chip selection will naturally dictate some of the shapes and dimensions discussed below. It should be appreciated, however, that the present invention is not so limited. Indeed, some aspects of the present invention anticipate the cooperation with may different smart card modules, and corresponding cavity 20 shapes and depths. For example, in one implementation, instead of the rectangular shaped cavity 20 as illustrated in FIG. 2A, we provide an oval shaped cavity. The oval shaped cavity cooperates, e.g., with an oval shaped smart card module (e.g., Atmel's model no. AT88SC1608-090T-00—headquartered in San Jose, Calif. USA). Of course there are many other cavity and module shapes and sizes that will fall within the scope of the present invention.

Returning to FIG. 2A, cavity 20 may include an upper chamber (or cavity) 20a and a lower chamber (or cavity) 20b. The depth D of the upper chamber 20a is generally dependent on a corresponding depth of the smart card module. We have found that it is generally preferable to seat the smart card module in the cavity 20 so that the module's interface is about flush with the outer surface of laminate 12, although the module's contact interface can slightly protrude above (or below) the laminate 12 surface. This seating arrangement helps to prevent the smart card module from catching on objects, which may undesirably unseat the module from the cavity 20. The upper chamber 20a, which is adjacently arranged to the lower chamber 20b, preferably includes a relatively larger aperture than the lower chamber 20b. The aperture differences between the lower cavity 20b and the upper cavity 20a result in a shelf 22. We have found that it is preferable (but not required) to provide the shelf 22 in the laminate layer 12, while allowing sufficient laminate shelf depth d, since a smart card module's adhesion (e.g., via adhesive) to the laminate layer 12 is generally superior than the module's adhesion (e.g., via adhesive) to adhesive layer 11 or core layer 10. If the depth d is too small, the shelf 22 may pull up and away from the adhesive 11 and/or core 10 layers. In some case we have found that too small of a depth d results in the shelf 22 and adhesive 11 together pulling up and away from the core 10. The depth d in our most preferred implementation is about 2 mils. Of course this depth may vary as structure layer depths or module dimensions vary.

If using the ID document 1 as shown in FIG. 1, the lower cavity 20b preferably extends through, e.g., the laminate 12 and adhesive 10, and into the core 10. A depth D+ of the lower cavity 20b is generally dependent on the vertical depth of the smart card module. While not necessary to practice the present invention, we can provide enough depth D+ so that the bottom of the smart card module will "float" in the well or otherwise not contact the bottom B of the well 20 when the ID card is at rest (see FIG. 2C). This floating arrangement provides somewhat of a cushion for the smart card module—allowing the card to flex without causing undue stress on the bottom of the smart card module. (We note that some thought should be given to the depth D+ of a well, since if the well is too deep, a card assembler risks having the bottom surface of the smart card module show through the remaining core depth—resulting in unwanted discoloration when viewed from the front of the card.) In our most preferred implementation, the D+ depth extends about 10 mils into the core layer. (Of course, this depth can be altered according to layer dimensions and smart card module used, etc.). In other implementations, the bottom and/or sides of a smart card module contact the bottom B and/or or sides, respectively, of the well 20, perhaps through an adhesive.

Figure 2B:
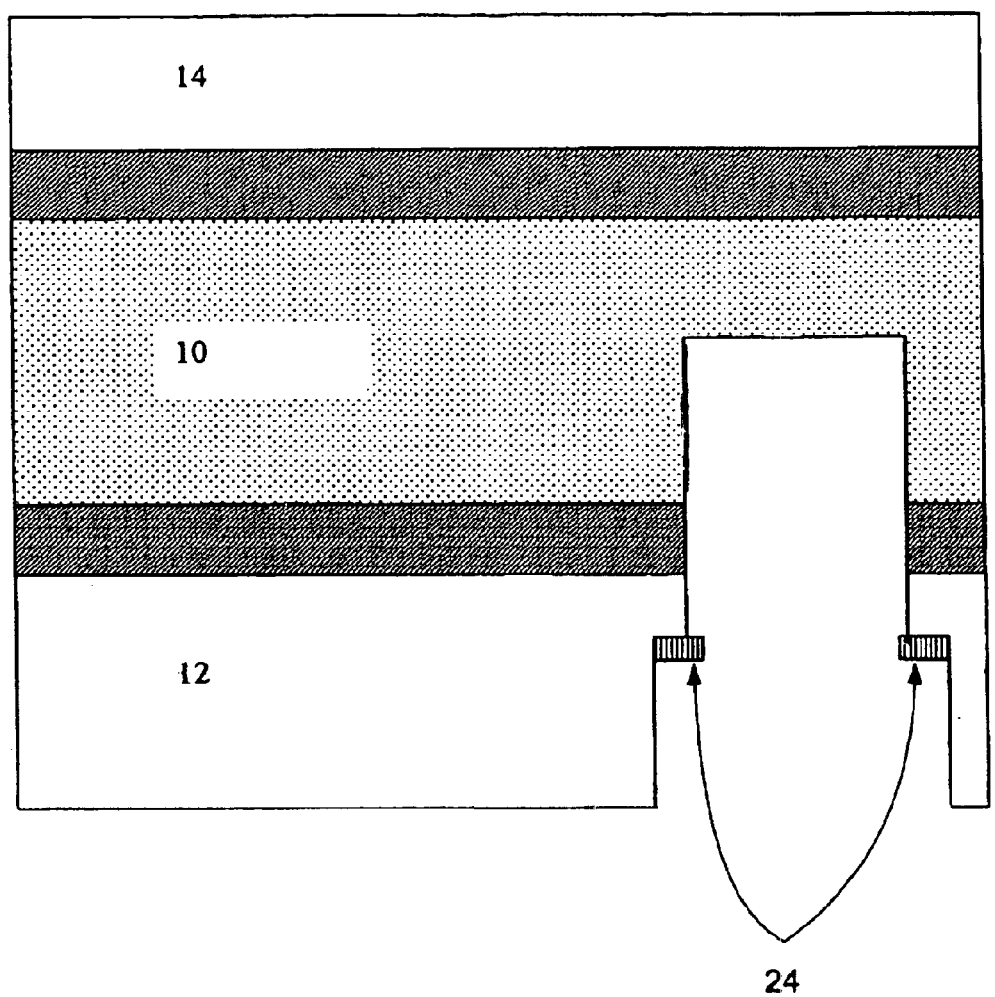
FIG. 2B is a cross-sectional view of the FIG. 2A document including adhesive provided on a layer shelf.

We preferably provide an adhesive to help secure a smart card module 26 in the cavity 20. There are several options for providing adhesive. With reference to FIG. 2B, we can provide an adhesive 24 directly onto shelf 22, e.g., through injection or spot adhesives. Alternatively, the smart card module can be coated with an adhesive on a side that is to be adjacently positioned with shelf 22. (We note that a smart ID document manufacturing method can be automated. In such cases, the smart card modules can be provided in roll form, e.g., one reel including about 7,500 chips. Adhesive (e.g., cyanoacrylate epoxy from Henkel of America, in Gulph Mills, Pa. USA) or a roll of glue tape (e.g., Tesa HAF 8410 HS or Tesa BDF 8410 from Tesa Tape, Inc. in Charlotte, N.C. USA) can be applied to the bottom side of the chip roll. Assembling machines provided by, e.g., Muhlbauer, headquartered in Roding, Germany, can be used for final assembly. Such an automated process may proceed by printing a card, laminating, cutting and verifying dimensions and printed information, and then milling, implanting a smart card module and then encoding or initializing the smart card module. Testing can be performed to detect a bad smart card module, etc.). In an implementation without shelf 22, we coat the sides and/or bottom of a smart card module with adhesive, and/or provide adhesive to a cavity and then insert the module.

Figure 2C:
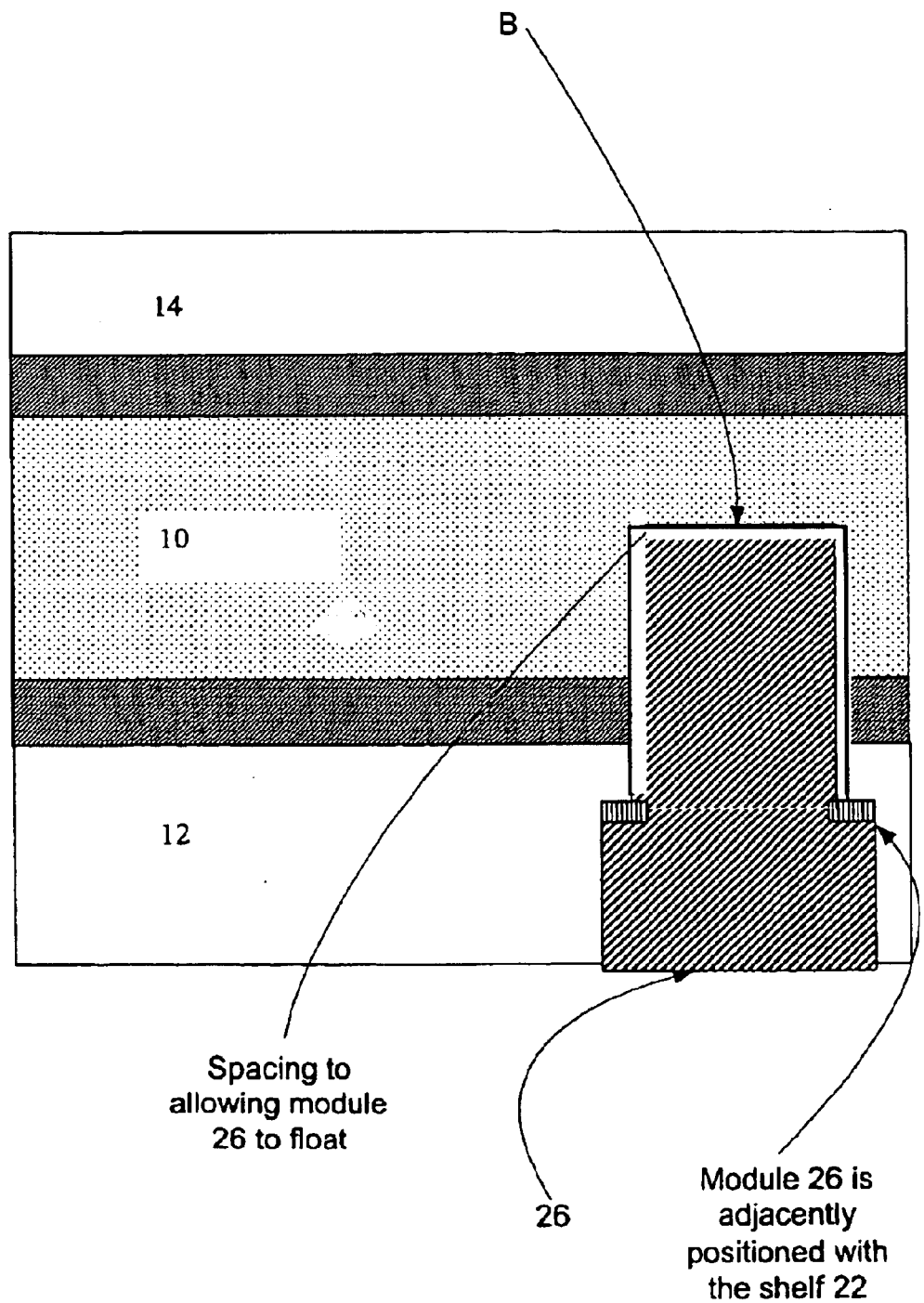
FIG. 2C is a cross-sectional view of the FIG. 2A document including a smart card module provided in the cavity.

A smart ID document results once the integrated circuitry module is secured in a cavity of an ID document (FIG. 2C). A smart card module can be optionally programmed to store relevant information such as information printed on the document, biometric information, account information, cryptographic hashes or other algorithmic representation of data, passwords, etc. One programmer example is a computerized smart card Personalizer, e.g., as provided by Muhlbauer of Germany, which enters commands or data into the smart card module. Other programmers are provided, e.g., from Hitachi and Atmel, among many others. Information stored in the smart card circuitry is optionally cross-correlated with information printed on the smart card. This cross-correlation can be checked to verify authenticity of the document or stored information. Or if a digital watermark is provided on the document, a watermark payload can be cross-correlated with information stored in the smart card's memory circuitry. A cross-correlation of the watermark information and the module's stored information can be analyzed to determine authenticity of the identification document.

Figure 3:
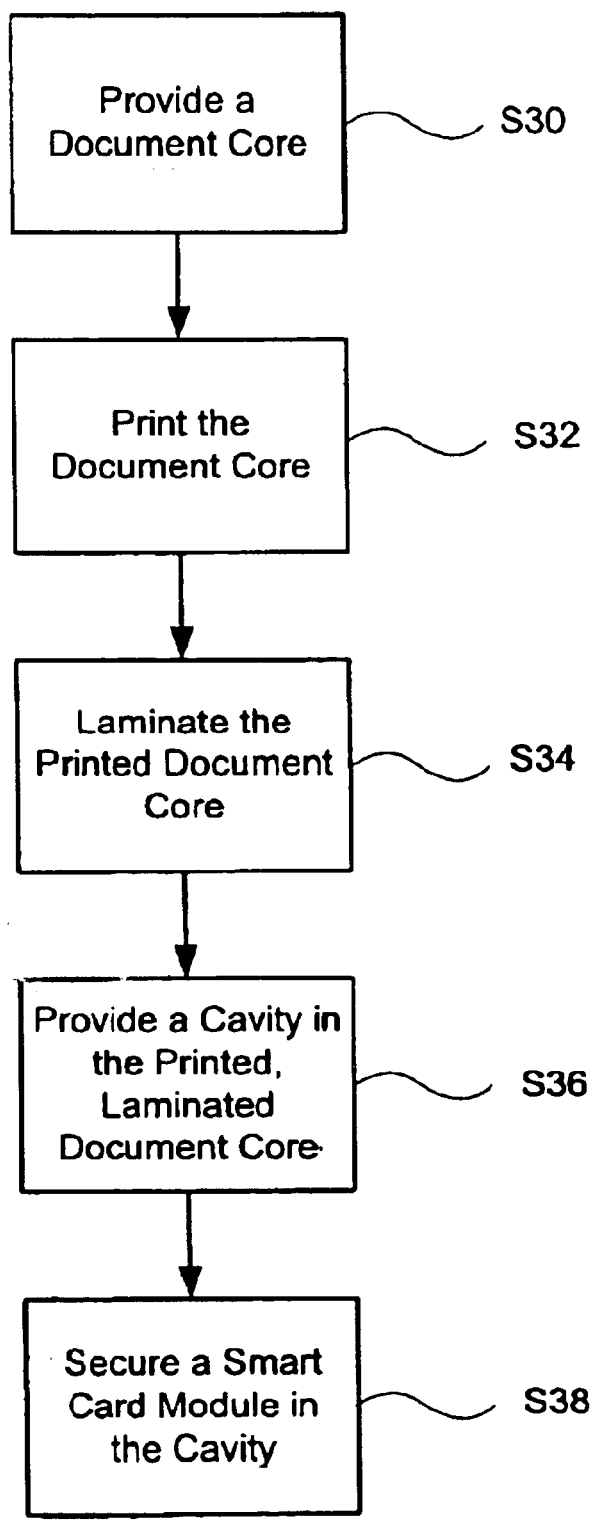
FIG. 3 is a flow diagram illustrating steps to manufacture, e.g., a contact-type smart identification document according to one aspect of the present invention.

FIG. 3 is a flow diagram illustrating the steps to manufacture a contact smart card according to one implementation. A document core or substrate is provided (step S30). The document substrate (or sometimes a laminate/adhesive layer) is printed (step S32), e.g., to include personalized or variable information. If printing on an inner laminate or adhesive layer, the printing may be reversed so it appears properly oriented when viewed from the outer surface of the laminate or adhesive layer. The printing may also include security patterns and designs, digital watermarks, and may also include optical variable devices, such as those provided with optical variable ink. A photograph may be included in the variable information. Printing options are widespread and may include, e.g., offset printing, screen printing, laser or ink jet printing, laser engraving, thermal transfer, etc. An image receiving layer can also be used, e.g., to better facilitate the reception of the information. The printed substrate is preferably laminated (step 34). The lamination process may involve adhesives or adhesive layers, but the present invention is not so limited. The laminate structure optionally may be cut to desired specifications (step not shown), if needed. A cavity or well is provided in the laminated, printed core (step S36). The cavity can be machined, milled, drilled, cut, etched (laser or chemical), etc. The cavity is preferably sized to accommodate a corresponding smart card module. In some implementations, the cavity extends into the core. The corresponding smart card module is secured in the cavity (step S38). While this method is anticipated to be most suited for contact-type smart card, we anticipate that some contactless-type smart card modules can be packaged such that they may also be provided in a cavity, e.g., as created with reference to FIGS. 2A–3.

Milling Operation (Example)

Figure 4A:
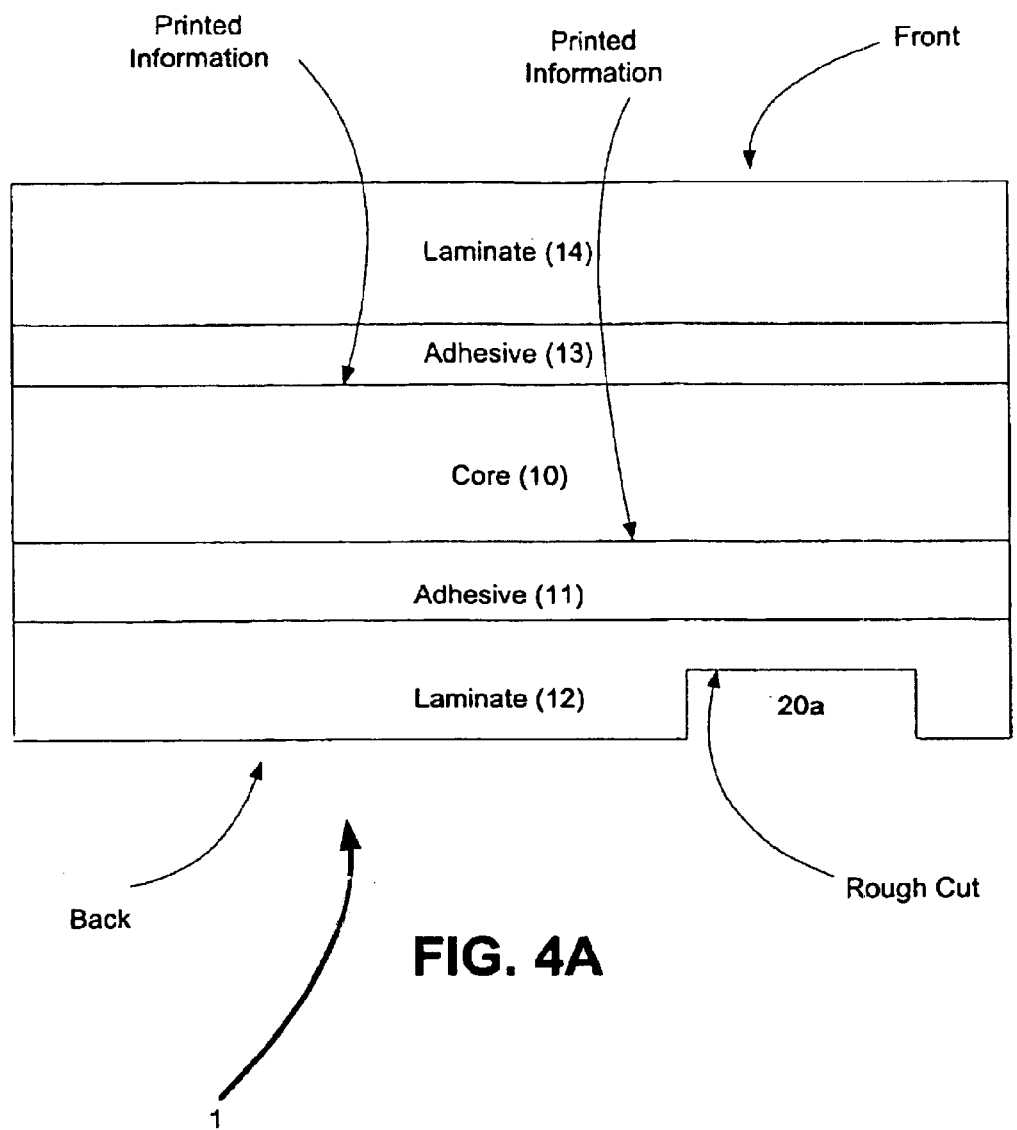
FIG. 4A is a cross-sectional view of the FIG. 1 document including an upper cavity provided in a laminate layer.
Figure 4B:
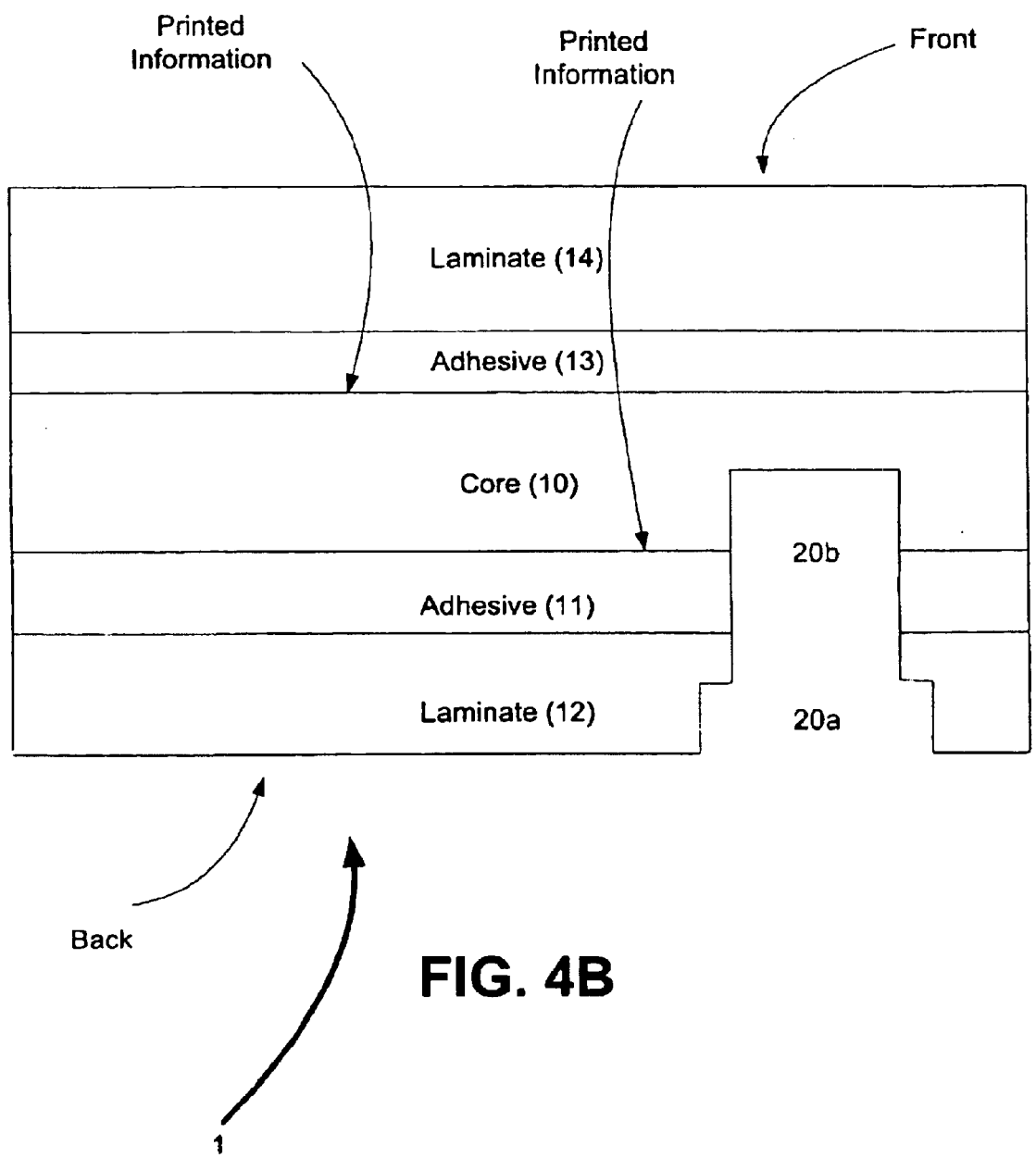
FIG. 4B is a cross-sectional view of the FIG. 4A document including a lower cavity extending into a core layer.
Figure 4C:
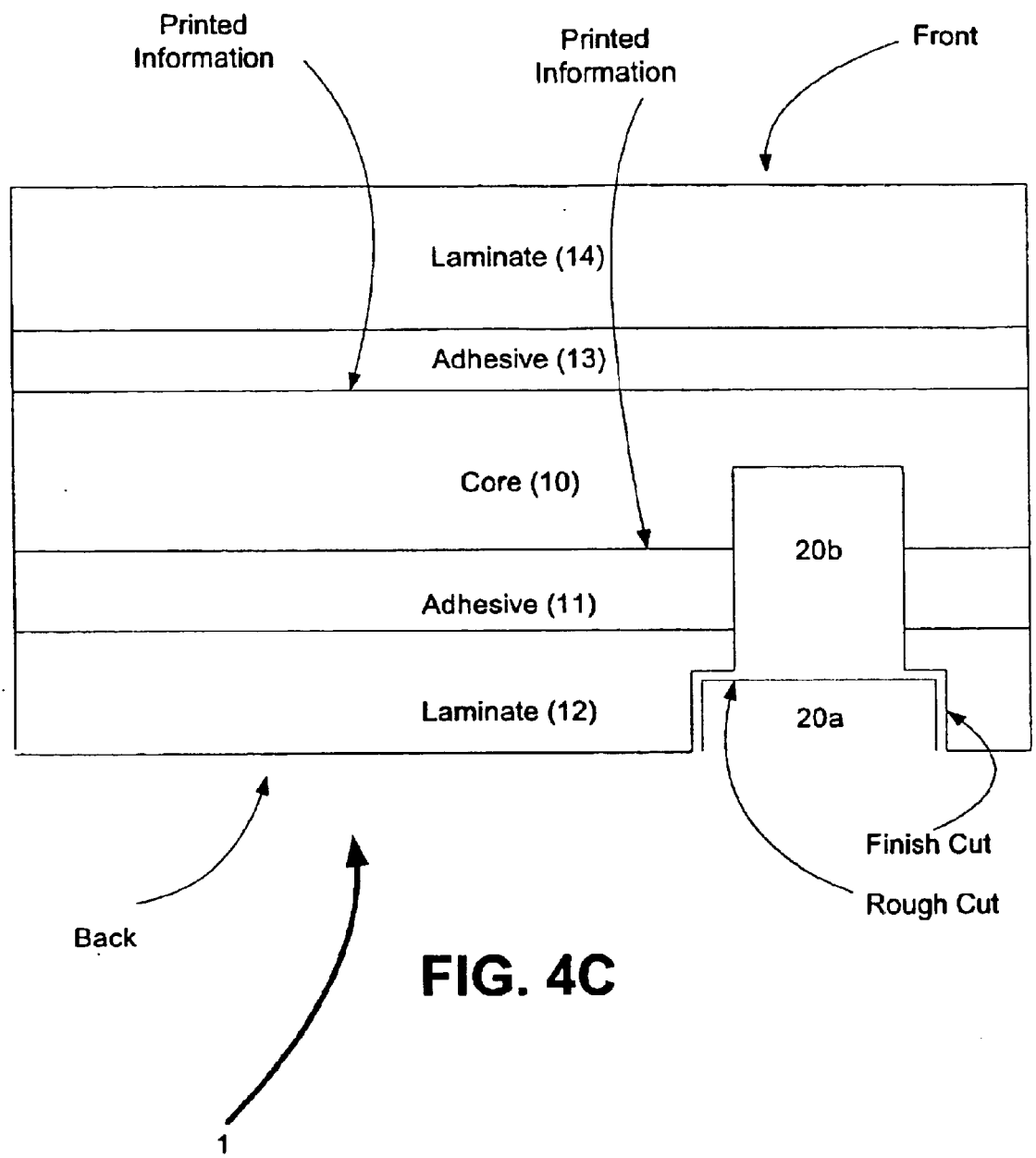
FIG. 4C is a cross-sectional view of the FIG. 4B document including a finish cut of the upper cavity.

FIGS. 4A–4C are cross sectional diagrams illustrating the methodology behind one milling implementation of the present invention. A cavity is milled to receive a smart card module. We note that the illustrated method is but one of many methods that can be used to mill or machine out a cavity in an ID document.

We start our milling discussion by returning to FIG. 1. FIG. 1 illustrates a multi-layered identification document including a core and laminates. We realized that the material used for the laminate (e.g., polycarbonates) and core (e.g., a synthetic like TESLIN) was susceptible to tearing or leaving burrs when cut. The illustrated milling technique (FIGS. 4A–4C) optimizes a milling operation to eliminate burrs in the multi-material cavity so that a smart card module can be securely mounted therein.

A milling (or machining or etching) tool contacts the back laminate 12 and machines a rough upper cavity 20a (see "Rough Cut" represented with dotted lines in FIG. 4A). The machining tool then (preferably after re-centering or realigning according to a reference or start position, or common axis) contacts the laminate at the bottom of the rough upper cavity to machine out the lower cavity 20b (see FIG. 4B). We then pass the machining tool back through the upper cavity (preferably after re-centering or realigning according to a reference or start position, or common axis) to shave or finish the upper cavity (see FIG. 4C). FIG. 4C illustrate the finish cut in relation to the original rough cut (dotted lines). An advantage of the finish pass is to clean up any rough edges or burrs left from the rough cut. The finish pass can be subtle, e.g., slightly expanding the upper cavity 20a while cleaning up debris and rough edges. (In our preferred implementation, the finish pass comprises about a 0.001 mil cut.) Table 1, below, illustrates software code that can be used to automate such a milling process. The code is written so as to operate a Muhlbauer cutting station, e.g., through a user interface (e.g., a text editor or graphical user interface) such as provided by Galil Motion Control, Inc. (Muhlbauer is headquartered in Roding, Germany, while Galil Motion Control, Inc. is headquartered in Rocklin, Calif. USA.). Of course, the dimensions and instructions as illustrated in the Table 1 software code can be changed according to need, card dimensions, module dimensions, card materials used, cutting station and interface, etc.

TABLE 1

```
#F30      !  Program Name  !
CRADIUS =1.8
POSX=15.1    !Defines center position for cavity on card  !
POSY=23.89
POSZ=0.0
JS #MOVXYZ
POSZ=0.18          !  Surface ruff cut – LEAVE .0015" FOR Finish cut!
POS1Z=0.18
LENGTHX=12.9   !  LEAVE about .010" FOR CLEAN-UP        !
WIDTHY=11.6    !  LEAVE about .010" FOR CLEAN-UP        !
RADIUS=2.3
JS#RECT            !    Milling Instruction            !
PR, –6000          !  Re-center over cavity  !
BGY
AMY
POSZ=0.47.         !  Lower Cavity final cut  !
POS1Z=0.47
LENGTHX=8.4
WIDTHY=8.7
RADIUS=1.8
JS #RECT           !  Milling Instruction   !
PR ,–5000          !    Re-center for finish cut   !
BGY
AMY
POSZ=0.21          !  Finish Cut    !
POS1Z=0.21
LENGTH=13.4
```

TABLE 1-continued

```
WIDTHY=12.1                !
RADIUS=2.3
JS #RECT         ! Milling Instruction        !
POSX=15.1        ! Return Tool to a home position !
POSY=23.89
POsz=0.0
JS #WAITPOS
END
```

In an alternative implementation, we make a rough cut for the lower cavity 20b, and then follow-up with finish cut for the lower cavity 20b. In other implementations, we make one cut for the upper cavity 20a, and one cut for the lower cavity 20b. In still further implementations, we provide a first cavity including the lower cavity 20b, and then expand the first cavity to includes the final upper cavity 20a. Debris can be evacuated from the cavity 20 through pressurized air or vacuuming, etc.

Milling Tool (Example)

FIGS. 5A-5D are diagrams of a milling tool that can be used to mill a cavity in an ID document. It should be appreciated that this is but one of many tools that can be used to provide a cavity in an identification document. In some cases, a laser or chemical process is used to create a cavity. In other implementations, conventional tools or cutters are used to machine or cut a cavity in an identification document. It will also be appreciated that while specific dimensions (in millimeters) are provided in the FIG. 5 representations, the present invention is not so limited. Indeed the dimensions can be changed in many respects without deviating from the scope of this aspect of the present invention.

Figure 5A:
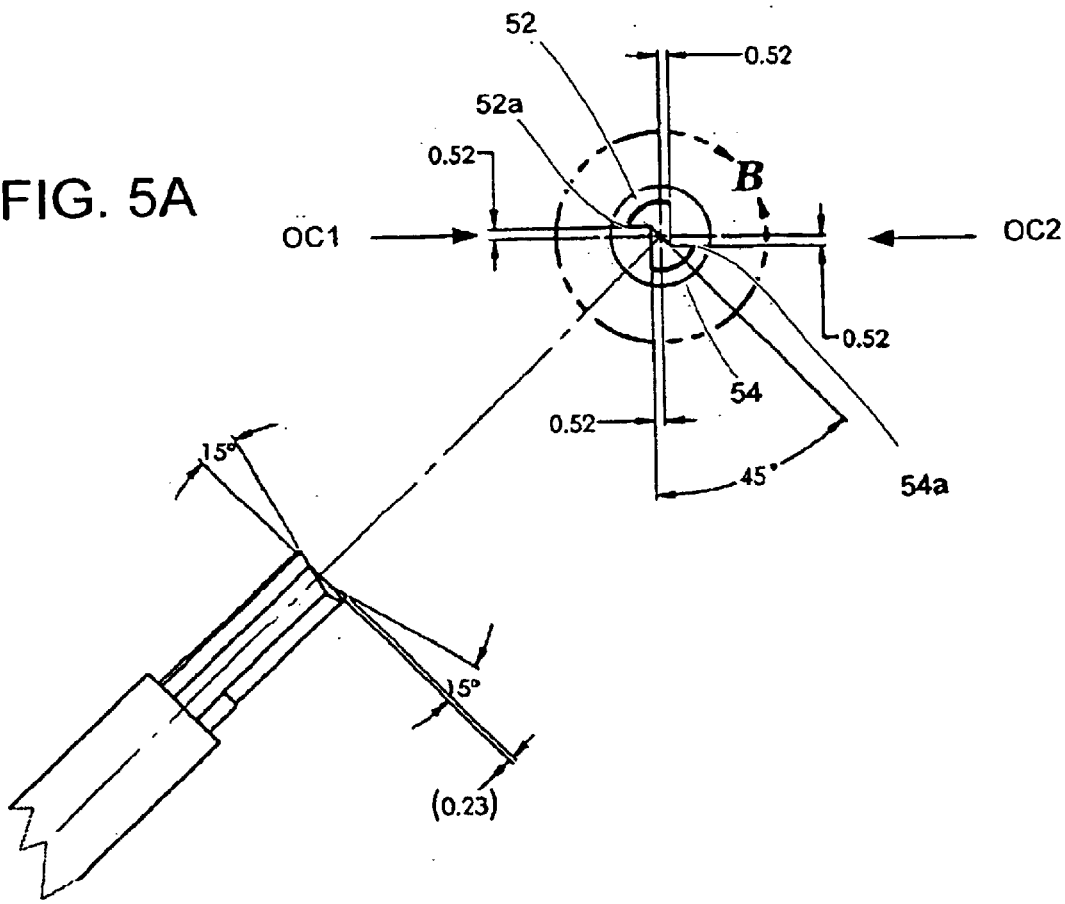
FIGS. 5A–5F are diagrams illustrating a milling tool according to one aspect of the present invention.
Figure 5B:
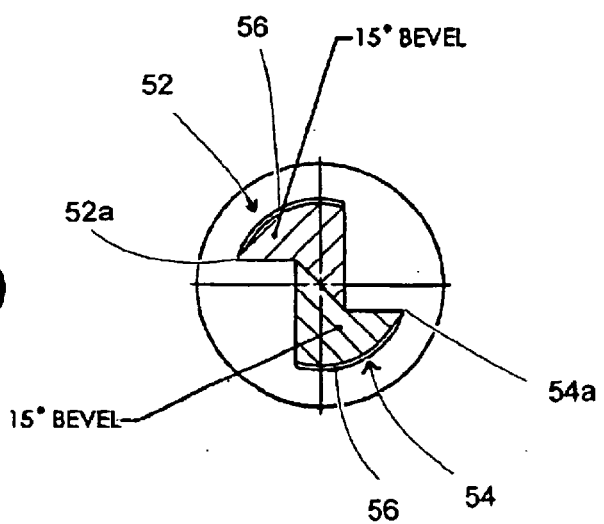
Figure 5C:
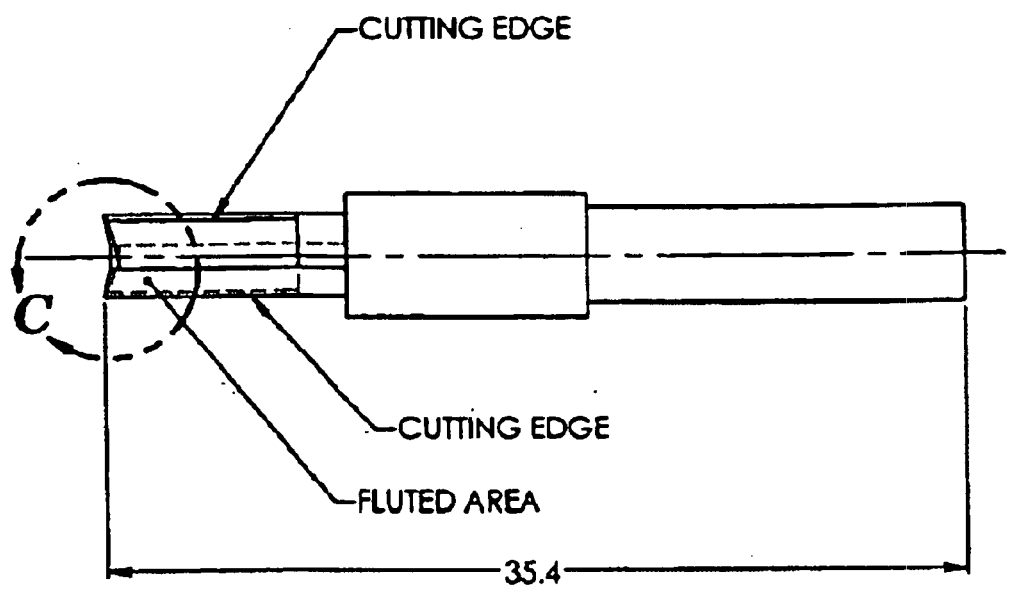
Figure 5D:
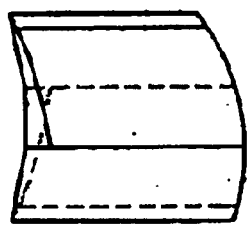
Figure 5E:
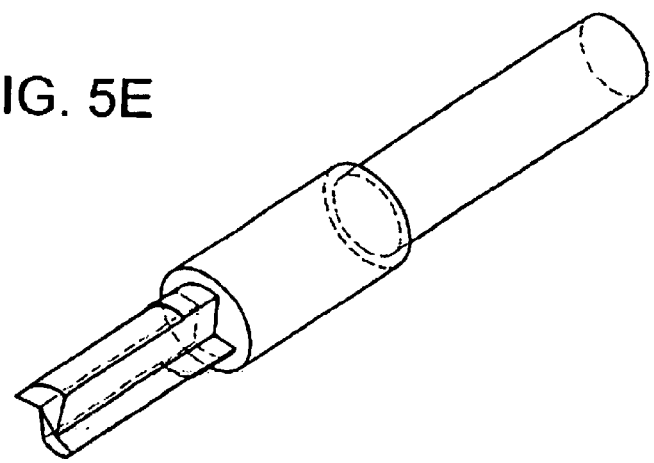
Figure 5F:
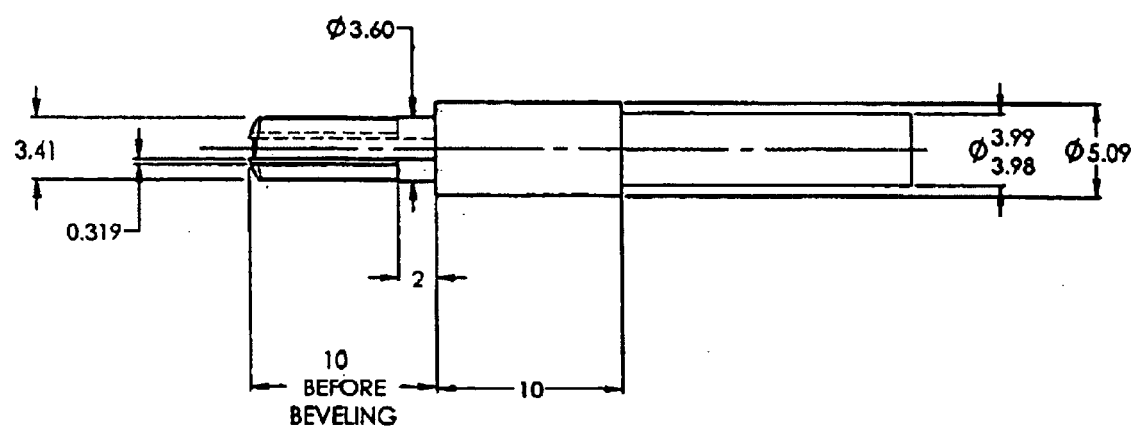

With reference to FIGS. 5A and 5B, the cutting tool 50 preferably includes a shaft 51 having a first 52 and second 54 section. The shaft 51 can be fluted as shown in the figures. The first section 52 includes a first cutting edge 52a and the second section 54 includes a second cutting edge 54a. Each of the cutting edges 52a and 54a can be off-centered (see OC1 and OC2 in FIG. 5A). Off-centering the cutting edges helps to provide an aggressive cutting tool, e.g., by increasing the tool's angle of attack (e.g., the angle at which a cutting edge encounters material to cut). A face (or surface) of each of the first and second cutting edges 52a and 54a is preferably beveled or tapered. The taper helps to ensure that the cutting edge is optimally presented to the document material. While the FIG. 5 representations may suggest a 15-degree bevel, we anticipate acceptable cuts with a tool including a bevel in a range of about 5–35 degrees. As shown in FIGS. 5A and 5B, a relief 56 can be provided for each of the cutting edges. The relief is another mechanism to help present the cutting edge to the material in a favorable manner. While the figures suggest a 45-degree relief, we anticipate that a relief in the range of about 30–60 degrees will provide acceptable results.

One advantage of this type of tool is that its configuration allows for a carving type cutting motion, in comparison to conventional tools that provide more of a scrapping or tearing motion. A carving motion allows for a clean cut, e.g., for shelf 22. A clean shelf allows for a better bonding surface with an adhesive.

Other features and advantages of this cutting tool are readily discernable from further examination of the drawings, including FIGS. 5C–5F.

Inventive Combinations

In addition to the inventive aspects detailed above and in the claims, some of the inventive combinations with respect to (e.g., contact-type) smart ID documents include the following:

A. An identification document comprising:
a core layer including a front side and a back side;
printed indicia formed on at least the front side of the core layer;
a first laminate layer secured with an adhesive to the back side of the core layer;
a second laminate layer secured with an adhesive to the front side of the core layer;
a cavity disposed in the first laminate, the cavity extending through the first laminate layer, adhesive and into the core layer; and
electronic circuitry disposed in the cavity.

A1. The identification document of combination A wherein the cavity comprises an upper cavity and a lower cavity, an aperture of the upper cavity being relatively larger than an aperture of the lower cavity so as to result in a shelf, wherein the electronic circuitry is packaged and a portion of the package is adjacently arranged on the shelf.

A2. The identification document of combination A1, wherein a portion of the package floats in the lower cavity.

A3. The identification document of combination A1, wherein the lower cavity includes a floor in the core layer, and wherein a portion of the package extends into the lower cavity but does not contact the floor when the identification document is at rest.

B. A manufacturing method comprising the steps of:
providing a first laminate and a second laminate, the first laminate comprising a front surface and a back surface, and the second laminate comprising a front surface and a back surface;
adjacently arranging an adhesive with the back surface of the first laminate;
adjacently arranging an adhesive with the back surface of the second laminate;
providing a core having top surface and a bottom surface;
laminating the first laminate, adhesive, core, adhesive and second laminate to form a structure;
machining a portion of the structure; and
providing an integrated circuitry module in the machined portion of the structure, the integrated circuitry module providing at least some smart card functionality.

B1. The method of combination B, further comprising a step of printing the core prior to said laminating step.

B2. The method of combination B1, wherein the printing comprises at least one of a photograph, name, birth date, social security number, signature and identification number.

B3. The method of combination B1, wherein the printing comprises at least one of: offset inks, process inks, thermal transfer, laser xerography and laser printer toners.

B4. The method of combination B1, further comprising the step of cutting the structure into the shape of an identification card.

B5. The method of combination B, wherein the core comprises a sheet of TESLIN.

B6. The method of combination B, wherein the at least some smart card functionality comprises at least one of data carrier, data manipulation, access control, identification verification, biometric carrier and data processing.

B7. The method of combination B1, wherein the printing comprises steganographic indicia.

B8. The method of combination B7, wherein the steganographic indicia comprises a digital watermark.

B9. The method of combination B8, wherein the digital watermark comprises a fragile watermark.

B10. The method of combination B8, wherein the integrated circuitry module comprises information stored therein, and wherein the information corresponds to the digital watermark for cross-correlation.

B11. An identification document made according to any one of the combinations set forth in B–B10.

C. A manufacturing method comprising the steps of:
providing a first laminate and a second laminate, the first laminate comprising a front surface and a back surface, and the second laminate comprising a front surface and a back surface;
providing a core having top surface and a bottom surface;
laminating the first laminate, second laminate and core to form a structure, the structure comprising the back surface of the first laminate in contact with the top surface of the core and the back surface of the second laminate in contact with the bottom surface of the core;
milling a cavity through the first laminate and into the core for affixing an integrated circuitry module; and
providing an integrated circuitry module in the cavity, the integrated circuitry module providing at least some smart card functionality.

C1. The method of combination C, further comprising the step of printing the core or second laminate prior to said laminating step.

C2. The method of combination C, wherein the core comprises a silica-filled polyolefin.

C3. The method of combination C, wherein the core comprises a synthetic paper.

C4. The method of combination C, wherein each of the first laminate and second laminate comprise an adhesive layer, the adhesive layers being arranged between the first laminate and the core and second laminate and the core, respectively.

C5. The method of combination C4, wherein the adhesive comprises a thermoplastic adhesive.

C6. The method of combination C, wherein at least one of the first laminate and the second laminate comprises a security feature.

C7. An identification document made according to combination C.

C8. An identification document made according to combination C4.

C9. The method of combination C, wherein said milling step creates a shelf in the first laminate layer, and wherein said providing an integrated circuitry module in the cavity step provides the module to be adjacently arranged on the shelf.

C10. The method of combination C9, wherein at least a portion of the module extends into the core layer.

C11. The method of combination C10, wherein the module portion that extends into the core layer does not extend to a bottom of the cavity.

D. A manufacturing method comprising the steps of:
providing a first laminate and a second laminate, the first laminate comprising a front surface and a back surface, and the second laminate comprising a front surface and a back surface;
coating the back surface of the first laminate with adhesive;
coating the back surface of the second laminate with adhesive;
providing a core having top surface and a bottom surface;
laminating the first laminate, second laminate and core to form a structure, the structure comprising the adhesively coated back surface of the first laminate in contact with the top surface of the core and the adhesively coated back surface of the second laminate in contact with the bottom surface of the core;
machining a portion of the structure; and
providing an integrated circuitry module in the machined portion of the structure, the integrated circuitry module providing at least some smart card functionality.

D1. A document made according to the method of combination D.

E. A manufacturing method comprising the steps of:
providing a first laminate and a second laminate, the first laminate comprising a front surface and a back surface, and the second laminate comprising a front surface and a back surface;
providing a core having top surface and a bottom surface;
laminating the first laminate, second laminate and core to form a structure, the structure comprising the back surface of the first laminate in contact with the top surface of the core and the back surface of the second laminate in contact with the bottom surface of the core; and
providing an integrated circuitry module in the structure, the integrated circuitry module providing at least some smart card functionality.

E1. A document made according to the method of combination E.

F. A method of milling a cavity in an identification document to receive a smart card module, the identification document comprising at least a laminate layer—document core sandwich structure, said method comprising:
providing a first cut in the laminate layer to create a rough upper cavity, the rough upper cavity including a first aperture;
providing a second cut to create a lower cavity, the lower cavity extending through the laminate layer into the document core, the lower cavity and the rough upper cavity being approximately centered around a common axis, wherein the aperture of the lower cavity is relatively smaller than the aperture of the rough upper cavity resulting in a shelf in the laminate layer; and
providing a third cut around the rough upper cavity to create a finished upper cavity, the finished upper cavity having an aperture which is larger than the aperture of the rough upper cavity, the finished upper cavity being approximately centered on the common axis.

F1. The method of combination F, wherein the laminate layer comprises an adhesive, so that the sandwich structure comprises a laminate—adhesive—document core structure.

F2. The method of combination F1, wherein the shelf is provided in laminate.

F3. The method of combination F2, wherein the document comprises document-holder specific printing thereon.

F4. The method of combination F, wherein the laminate layer comprises a polymer and the document core comprises a synthetic paper.

F5. The method of combination F4, wherein the synthetic paper comprises TESLIN.

F6. An identification document made according to any one of the methods set forth in combinations F–F5.

G. A contact smart card comprising:
a core layer including a top surface and a back surface;
a first laminate layer adjacently secured to the top surface core layer;
a second laminate layer adjacently secured to back surface of the core layer;
printed indicia provided either on the top surface of the core layer or on a surface of the first laminate layer that is to be secured to the top surface of the core, the indicia comprising at least some information that is unique to a bearer of the contact smart card;
a well disposed in at least the second laminate layer; and
an integrated circuitry module provided in the well, the module including a contact surface.

G1. The contact smart card of combination G, wherein the well includes a shelf in the laminate layer and the well extends into the core layer, and wherein at least a first portion of the module is adjacently arranged on the shelf and a second portion of the module extends into the core layer.

G2. The contact smart card of combination G wherein the information comprises a photographic representation of the bearer.

H. A milling tool for milling a polymer and a synthetic paper structure for receiving a smart card module comprising:

a fluted shaft having a first section and a second section;
a first cutting edge having a first bevel disposed on the first section;
a second cutting edge having a second bevel disposed on the second section, the first and second cutting edges forming a first axis; and
wherein a non-cutting end of the first bevel and a non-cutting end the second bevel form a second axis which is rotated at a first angle in a range of 15–60 degrees from the first axis.

H1. The milling tool of combination H, wherein the first bevel is tapered in a range of 5 and 45 degrees.

H2. The milling tool of combination H, wherein the first bevel is tapered at an angle of 15 degrees.

H3. The milling tool of combination H, wherein the second bevel is tapered in a range of 5 and 45 degrees.

H4. The milling tool of combination H3, wherein the second bevel is tapered at an angle of 15 degrees.

H5. The milling tool of combination H3 wherein the first angle comprises 45 degrees.

Section 2: Contactless Smart Cards Including Multi-Layered Structure

The following section primarily focuses on contactless smart cards. However, it should be appreciated that our inventive techniques can be extended to include contact smart card and other identification documents as well. A contactless smart card can be generalized as a card including integrated electronic circuitry. Unlike a contact-type smart card, where the integrated electronic circuitry communicates via a physical contact interface, a contactless smart card communicates (e.g., transfers/receives) data via an antenna or transceiver structure. The antenna (or transceiver) is connected to the integrated circuitry. A contactless smart card may include an internal power source to energize its electronic circuitry. Alternatively, the integrated circuitry can be energized through electromagnetic energy received through the antenna (or other transceiver structure). The integrated circuitry can include data processing circuitry for processing or manipulating data or software instructions, and/or memory circuitry for data storage. (Of course, the circuitry can include other components such as a clock generator, system bus structure, and buffers, etc., etc.).

Some contactless smart cards have heretofore been affiliated with their fair share of problems. One problem is protecting the contact between the antenna and the integrated circuitry. Communication ability of a contactless smart card will be lost or hampered if the contact between an antenna and circuitry is severed. Protecting this connection becomes a chore, since smart cards are alien subjected to onerous stresses and flexing. An associated problem with conventional smart cards is longevity. We have found that conventional contactless smart cards crack, degrade, and/or fail to operate as anticipated. We overcome some or all of these drawbacks in one implementation of an inventive contactless smart card.

Another implementation of contactless smart cards combines a contactless smart card with the benefits of an identification document. Some identification document benefits may include (but are not limited to): photographic representations, personalized information, security indicia, over-laminate layers, etc., etc.

In another implementation of a contactless smart card, we provide a multi-layered card structure that provides the benefits of a smart card with the durability and flexibility of a multi-layer structure. Multi-layers may also provide protection from unwanted radiation, e.g., ultraviolet radiation, which may interfere with contactless communication.

In yet another implementation of a contactless smart card, we employ a central issue (CI) type issuing model when producing inventive contactless smart cards. A central issue model allows us to tightly control the materials and processing of contactless smart cards.

These and further features, implementations and advantages of our contactless smart cards (or "contactless smart ID documents") will become even more evident with reference to the following disclosure and corresponding figures.

Figure 6:
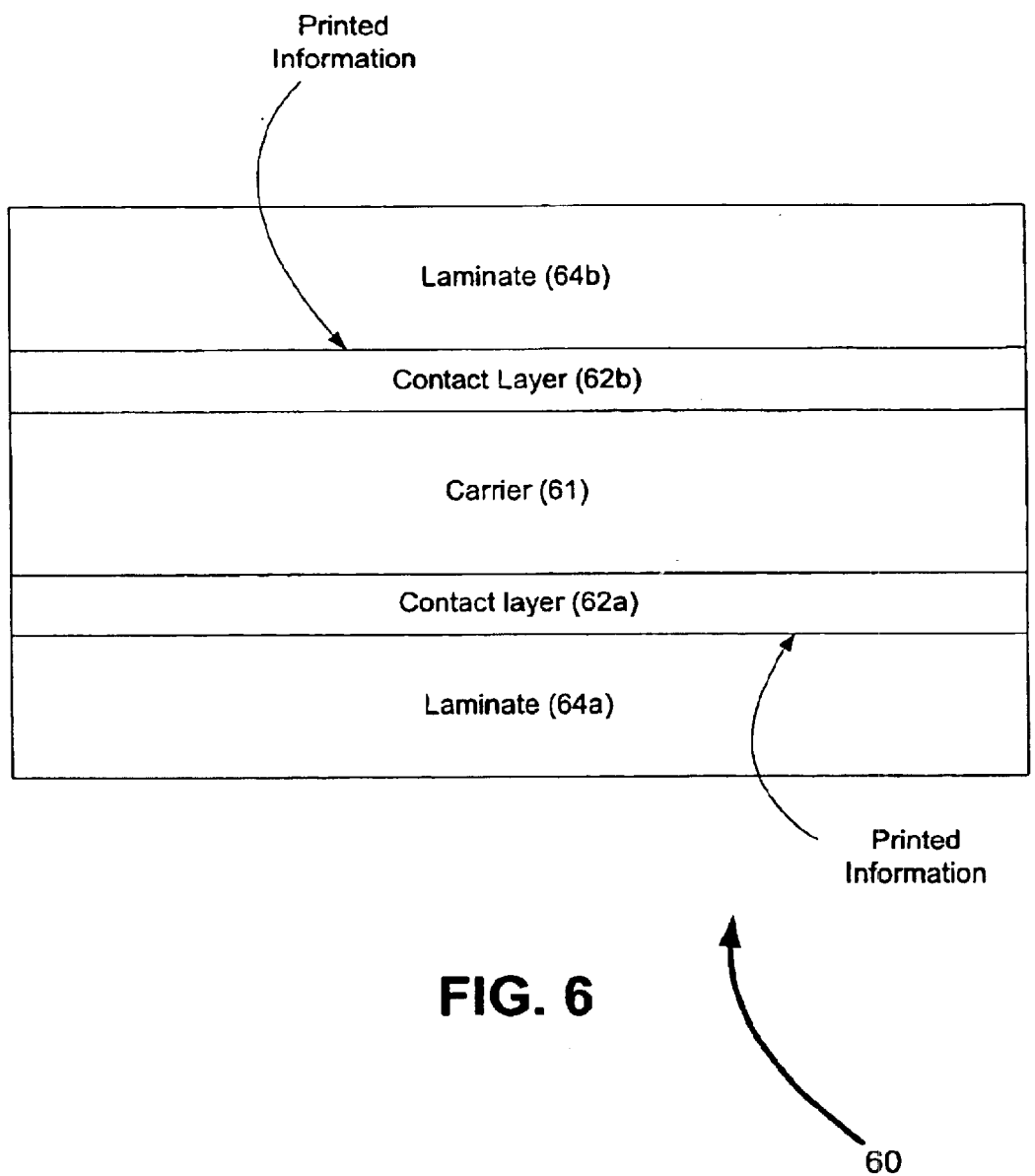
FIG. 6 is a cross-sectional view of a contactless smart identification document according to one implementation.
Figure 10:
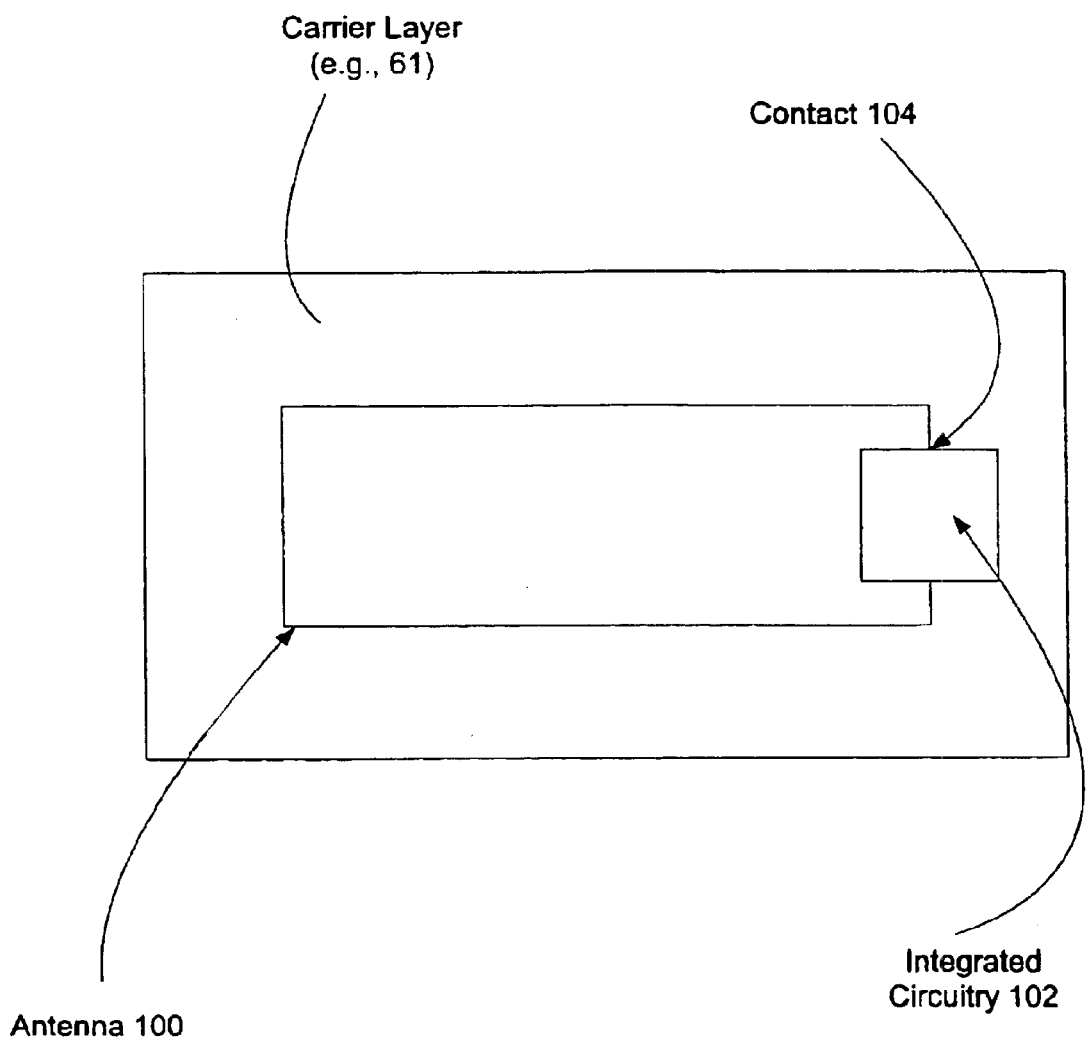
FIG. 10 is a top view of a contactless smart identification document's carrier layer including an antenna and integrated circuitry according to one aspect of the present invention.

One implementation of a multi-layer contactless smart card 60 (or smart ID document) is disclosed with reference to FIG. 6. A carrier layer 61 is provided. The carrier layer 61 carries or includes a contactless smart card module, such as an antenna 100 (or transceiver, etc.), and electronic circuitry 102 (see FIG. 10). The circuitry 102 may include processing and memory circuitry (e.g., 2K-256K bytes, etc.). In some cases a chip operating system is employed with the integrated circuitry 102. The antenna communicates with the circuitry 102 through an interface or contact 104. (Note that there may be more or less contacts as shown in FIG. 10.). Of course, the antenna 100 can include a plurality of receiving elements (e.g., loops or coils, copper wiring, etc.).

The carrier 61 is sandwiched between contact layers 62a and 62b. Contact layers 62a and 62b may include, e.g., a polymer, synthetic, composite, etc., and can include a layered structure such as a polymer-adhesive layering. The carrier layer 61 is preferably permeable, e.g., like a mesh or scrim. The carrier layer 61 material can be composed of many different materials including, e.g., polymers, PET (polyethylene terephthalate), PET fibers, polycarbonate, polyester, poly-composite, polystyrene, cellulose ester, polyolefin, polysulfone, poly-bends, composites, etc., etc. One suitable scrim material that includes contactless smart card circuitry and transceiver means is provided by Hitachi Semiconductor (America), Inc., with US headquarters in San Jose, Calif. (For example, Hitachi can provide a scrim inlay, in sheet sizes of about 15¾"×24", including 6-by-6 wired antennas and corresponding integrated circuits, each antenna/circuit/carrier layer have a dimension of about 45 mm×77 mm. When using scrim sheets, and/or when aligning individual antenna/circuitry, some care should be given to ensure proper alignment of the carrier layer 61 (e.g., including the antenna/circuitry) when considering cutting (e.g., die cutting), preprint information and/or personalization of a contactless smart identification document. If using a mesh material, we have found excellent results when using a mesh weight-per-area ratio in a range of about 5 grams/$m^2$ –20 grams/$m^2$. Our most preferred mesh includes a ratio of about 10 grams/$m^2$. In some implementations the antenna 100 and integrated circuitry 102 are positioned or embedded between two sheets of carrier (e.g., scrim or mesh) material. Of course, there are many other acceptable carrier layers and/or contactless smart card modules that are suitably interchangeable with this aspect of the present invention such as those provided by Philips and Sony, among many others.

A permeable carrier 61 facilitates the migration of contact layers 62a and 62b into and/or through the carrier layer 61 during a lamination (e.g., heat and/or pressure) process. The migration of the contact layers into and/or through the carrier 61 helps to firmly secure the smart card module, including the contact 104 between the antenna 100 and integrated electronic circuitry 102.

In an alternative implementation we embed (e.g., through injection molding, lamination, etc.) a contactless smart card module in a carrier layer 61. The carrier layer 61 is generally solid instead of permeable in this implementation. In this implementation the carrier layer 61 preferably includes a material that is receptive to lamination or bonding, e.g., a polymer or adhesive material. In still a further alternative implementation, a carrier layer 61 comprises a metal or conductive material (e.g., copper wiring). The carrier layer 61 itself serves as the antenna 100, which is connected to the electronic circuitry 102 via a contact 104.

Regardless of which implementation is employed, contact layer 62a and/or 62b can receive indicia (or printing) provided thereon. The printing may include information that is typically associated with an identification document, such as a photographic representation of the card bearer, variable information, e.g., name, address, sex, height, weight, biometric information, signature, and/or citizenship, etc., etc. The printing may optionally include so-called fixed information such as information pertaining to an issuing authority, security feature (e.g., optical variable devices, etc.), etc. In other implementations, the indicia includes a digital watermark. Instead of printing information on the contact layer 62a or 62b surface, we sometimes print information on an underside of an laminate/adhesive (e.g., 64a and/or 64b). If printing on an inner laminate or adhesive layer, the printing may be reversed so it appears properly oriented when viewed from an outer surface of the laminate or adhesive layer. In some implementations, the ink and printing techniques disclosed in Bentley Bloomberg and Bob Jones' patent application titled "INK WITH COHESIVE FAILURE AND IDENTIFICATION DOCUMENT INCLUDING SAME," filed concurrently herewith will be used to print a contactless (or contact) smart identification document. Printing techniques may include offset, gravure, screen, thermal transfer, ink or laser jet, etc.

In some implementations of our contactless smart ID document, we pre-print information onto a layer surface. The pre-printed information may include variable or fixed information.

Generally transparent laminate layers 64a and 64b are provided over the contact layers 62a and 62b, respectively. The laminate layers 64a and 64b are secured to the contact layers, e.g., through a conventional lamination process involving heat and/or pressure. Laminates like those discussed above in Section 1 can be used here also. Laminate layers 64a and 64b provide some degree of intrusion protection for information printed on the smart card, as well as providing additional strength and a moisture barrier.

Figure 7:
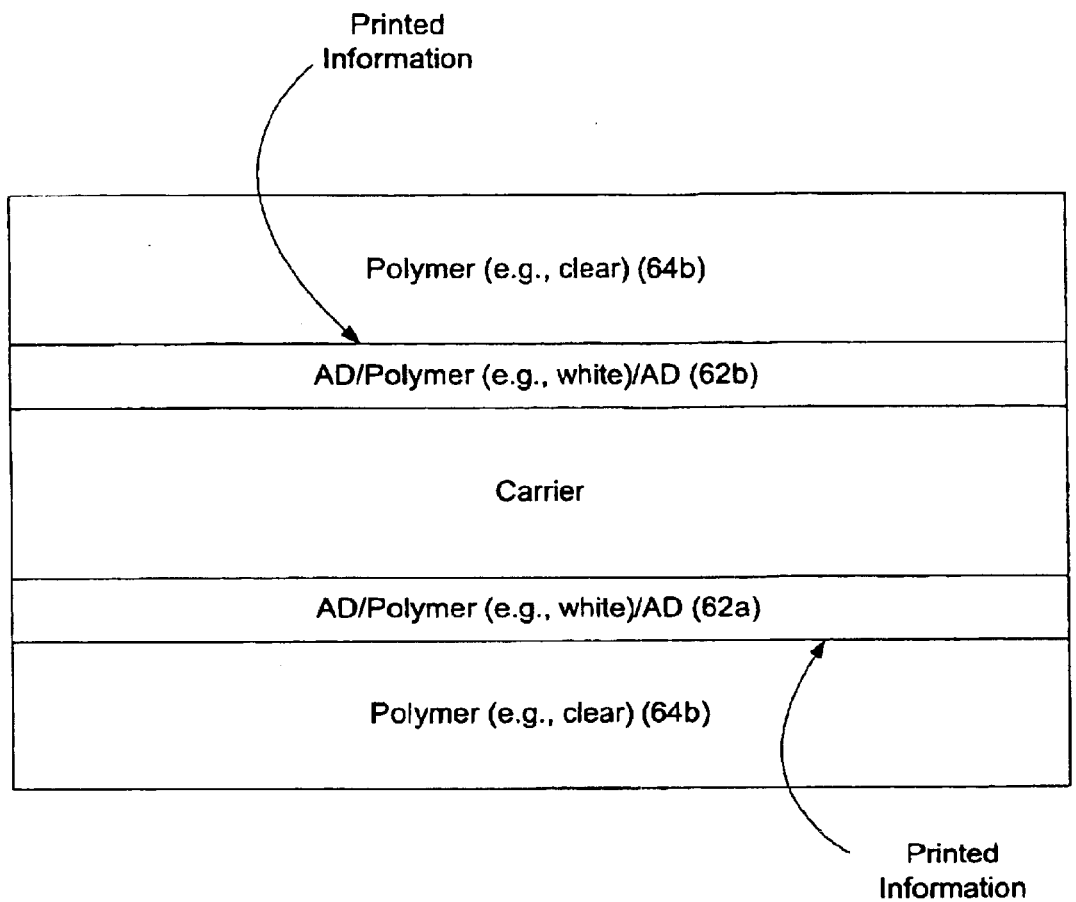
FIG. 7 is a cross-sectional view of another implementation of a contactless smart identification document.

While specific dimensions may be dictated according to identification document required standards, we note that our preferred dimensions for the contactless smart identification document shown in FIG. 7 include: carrier (3–15 mils); contact layers (3–16 mils); and laminate (2–15 mils). A preferred range of document depths is between about 27–40 mils, with our most preferred document depth includes about 30 mils.

Further implementations and examples of contactless smart identification documents are discussed with reference to FIGS. 7–12.

With reference to FIG. 7, contact layers 62a and 62b include an adhesive (AD)/polymer/adhesive (AD) structure. The adhesive can be coated or layered on the polymer. The polymer layers (62a and 62b) may be formed from any polymer, for example polyester, polystyrene, cellulose ester, polyolefin, polysulfone, or polyimide. Either an amorphous or biaxially oriented polymer may be used. But we use polycarbonate as our most preferred polymer. The polymer 62a and 62b can be colored, e.g., white, to help accentuate indicia provided thereon or on the laminate layers 64a or 64b. (In some implementations (not shown), we even provide a synthetic with adhesive layers (e.g., adhesively coated TESLIN), composite, poly-bend and/or paper—instead of a polymer—as a contact layer 62a and 62b material.). The contact layers 62a and 62b can optionally include coloration, e.g., white, if desired. The adhesive layers AD (or coating) help secure the contact layers 62a and 62b to the carrier layer 61 and to the laminate layers 64a and 64b during a lamination process. In one implementation the adhesive comprises a co-extruded polyurethane (PU) (e.g., with a soft point between about 230–290° F.). In another implementation we use an aliphatic PU-based adhesive, CLA-93A, from Thermedics, Inc. in Woburn, Mass. Still another suitable adhesive is KRTY as provided by Transilwrap, headquartered in Franklin Park, Ill. 60131 USA. Other suitable adhesives may include polyester, polyester urethane, polyether urethane, polyolefin, poly-composites, thermoplastic adhesives, and/or a hot melt or ultraviolet or thermally cured adhesive; of course, an adhesive may be coated, extruded or cast on to one surface of the polymer layer. The laminate layers 64a and 64b can also include, e.g., a polymer, polycarbonate, polyester, polyester urethane, poly-composite, polystyrene, polybutylene terephthalate (PBT), cellulose ester, polyolefin, polysulfone, polyimide, and/or polybutylene terephthalate (PBT), etc. Here again, our most preferred laminate layers 64a and 64b each comprise polycarbonate. Polycarbonate sheets are widely available, e.g., from GE Plastics, headquartered in Pittsfield, Mass.

Figure 8:
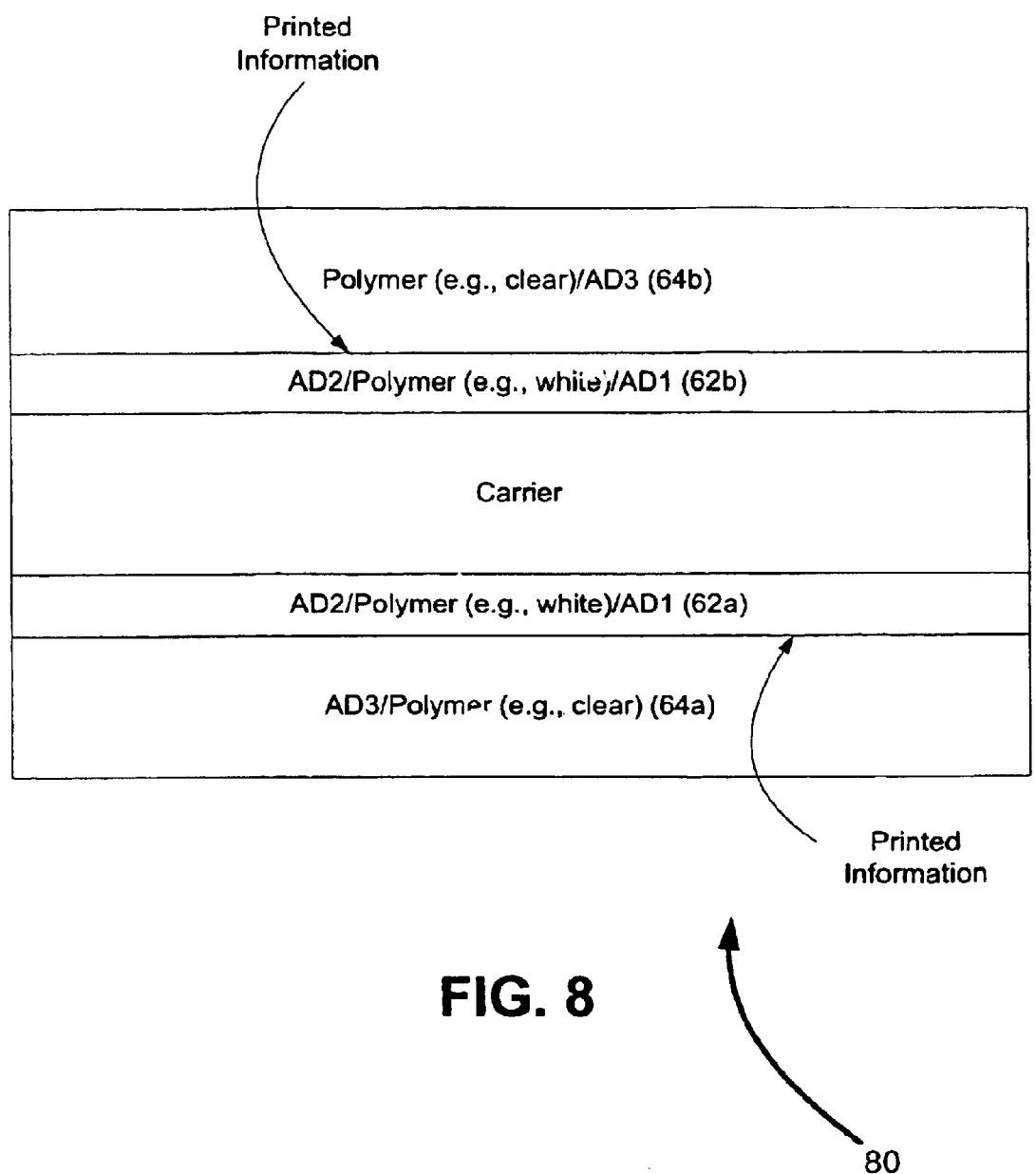
FIG. 8 is a cross-sectional view of still another implementation of a contactless smart identification document.

With reference to FIG. 8, contact layers 62a and 62b preferably include an Adhesive (AD2)/Polymer/Adhesive (AD1) structure, while the laminates (64a and 64b) preferably include a Polymer/Adhesive (AD3) structure. Adhesive 2 is selected so as to provide a favorable bond with Adhesive 1 and Adhesive 3. Similarly, Adhesive 1 is selected to favorably bond with adhesive 2 and 3. (In some cases, Adhesive 2 and Adhesive 3 will comprise the same adhesive.). Our most preferred implementation employs a polycarbonate as the polymer and polyurethane as the adhesives. Of course, other materials as discussed above can be used instead. If the adhesive layers include polyurethane, and since the foundation of polyurethane chemistry is generally based on isocyanate, a variety of monomers and different reactions can be exploited for synthesis of polymeric materials with desired properties, such as flexibility, toughness, durability, adhesion, and UV-stability by other additives. Additional polyurethane compounds need not be explored herein; rather, one inventive concept is applying different polyurethane compounds to the various layers to achieve desired properties.

Figure 9:
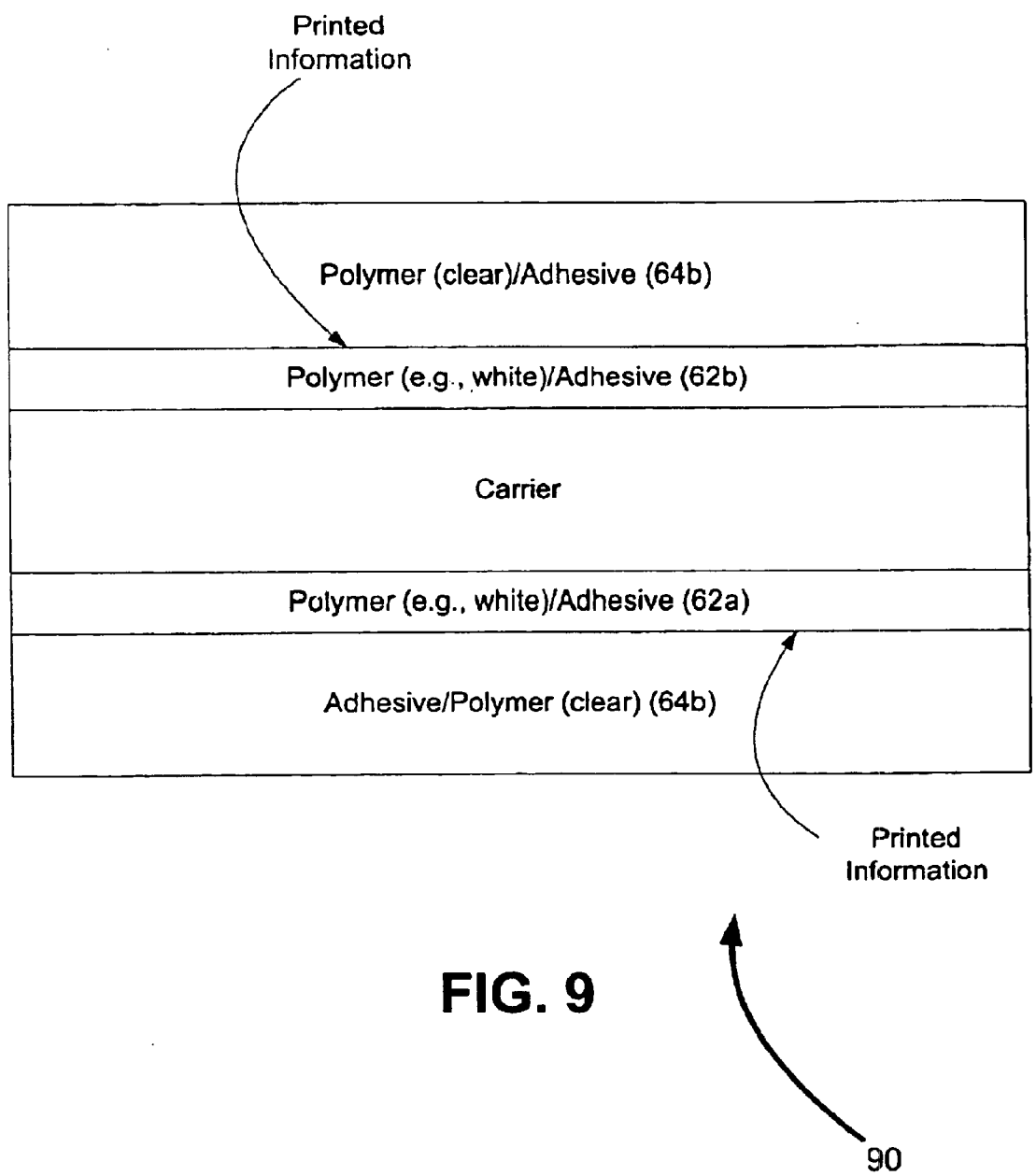
FIG. 9 is a cross-sectional view of yet another implementation of a contactless smart identification document.

With reference to FIG. 9, our contact layers 62a and 62b and our laminate layers 64a and 64b each comprise a polymer (or synthetic)/adhesive structure. The adhesive sides (or coating) contact one another to help form a bond. Our most preferred implementation employs a polycarbonate as the polymer and a polyurethane as the adhesive. Of course, other materials as discussed in this patent document and those known in the art as suitable equivalents can be used instead.

Figure 11:
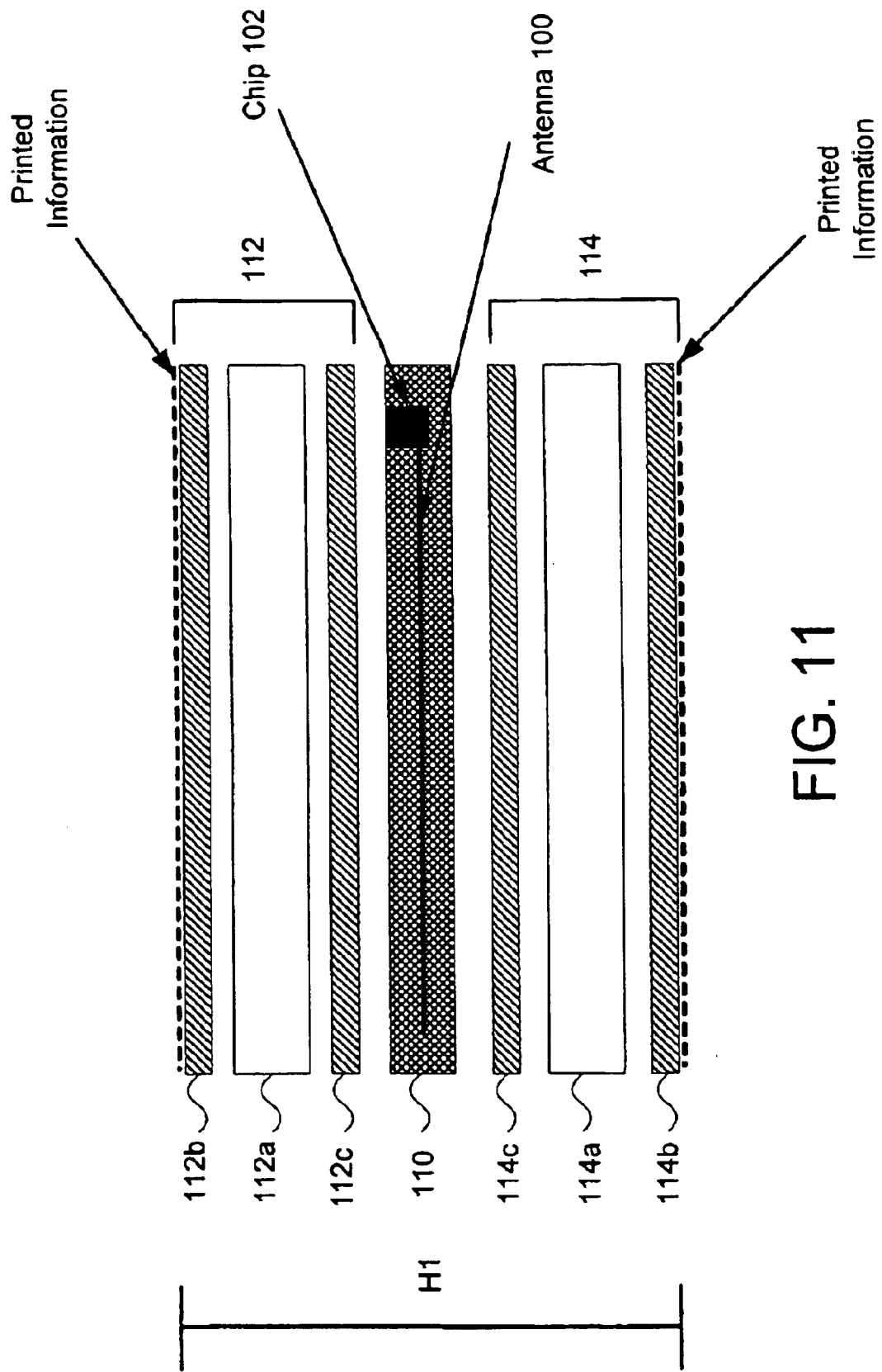
FIG. 11 is a cross-sectional view of a contactless smart identification document according to another implementation of the present invention.

With reference to FIG. 11, we provide yet another example of a contactless smart identification document. We start with scrim inlay sheets (e.g., with a sheet size of about 15¾"×24" that include about 6×6 antenna 100/chip 102 structures, with each antenna/chip structure having a dimension of about 45 mm×77 mm, as can be supplied from HITACHI). Of course the scrim inlay sheets can be cut or otherwise sized as well. The antenna/chip structure is preferably disposed between (or embedded) two scrim layers or sheets to form a scrim core 110.

The scrim core 110 is preferably sandwiched between contact layers 112 and 114. Each contact layer 112 and 114 preferably includes a polycarbonate layer (a) and polyurethane layers (b and c) (e.g., each layer comprises about 2 mils of polyurethane (e.g., CLA93A from Thermedics, Inc.), about 8 mils of white polycarbonate film (e.g., as supplied by GE Plastics), and about 2 mils of polyurethane (e.g., CLA93A)). The polyurethane layers (b and c) can be coated, extruded, sprayed, layered, etc. onto the polycarbonate layer (a). Some care is given to the alignment of the scrim 110 (e.g., including multiple antenna/chip structures) and contact layers 112 and 114 to allow for favorable printing and cutting down stream. In some situations, we can even provide a registration marker (e.g., printing) on an outer surface of the polycarbonate or polyurethane to help properly align the contact layers 112 and 114. In other cases we provide information (e.g., so-called fixed indicia) on an outer surface of layer 112b and 114c. The information can be offset printed, xerographically printed, laser printed, gravure printed, etc., etc.

Contact layers 112 and 114 are secured to the scrim core 110. For example, we attach the contact layers 112 and 114 through a lamination process (e.g., a heated surface, roller, or iron press). The H1 structure shown in FIG. 11 results (i.e., without the spacing as illustrated). A preferred resulting structure is an 8.5"×11" sheet, including a laminated scrim core 110/contact layer 112 and 114 structure. Of course, other sheet sizes can be used as well. If using an 8.5"×11" sheet there are usually about nine antenna/chip structures per sheet. We have two preferred branches in our process at this point. A first branch includes cutting (e.g., die cutting) the sheet into blanks after the H1 structure is assembled. Each blank includes one antenna/chip structure having a cross-section as shown in FIG. 11. The blanks can be, e.g., supplied to an over-the-counter issuing station, and further processed by, for example, printing personal information on the blank or on an over-laminate and/or programming the on-card chip.

Figure 12:
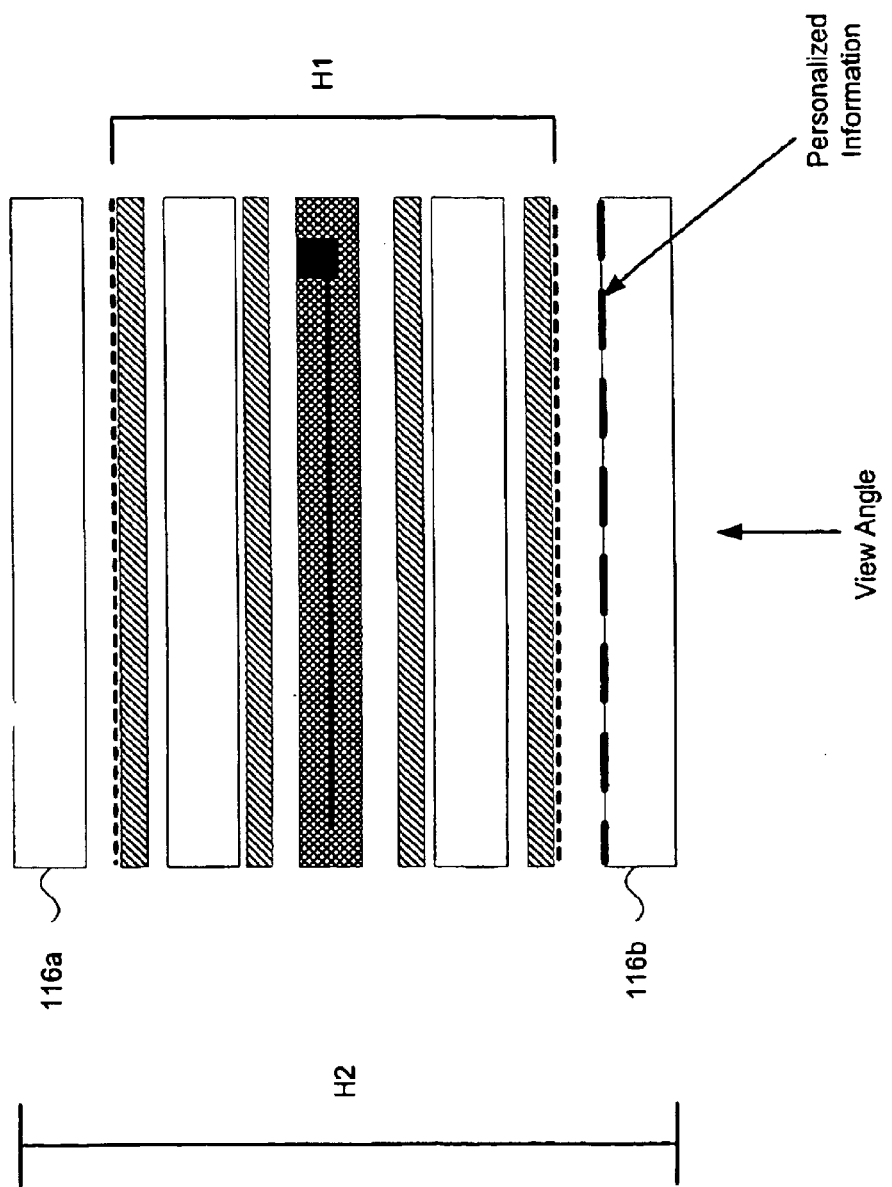
FIG. 12 is a cross-sectional view of the FIG. 11 contactless smart identification document including over-laminates.

The second branch, perhaps better suited for use with a central-issue model, is discussed with reference to FIG. 12. The H1 structure sheet (e.g., including multiple antenna/chip structures) is even further protected by providing over-laminate sheets 116a and 116b (e.g., 7 mil clear polycarbonate, e.g., HP92W supplied from GE Plastics). In some cases, the over-laminates 116a and 116b will include an adhesive (not shown) to even further help the lamination process. The laminate layers 116a and 116b are preferably personalized prior to lamination. The personalization may include printing variable information (e.g., photographs, text, graphics, signatures, etc., etc.) through laser printing (e.g., Xerox's DOC12 laser printer), ink jet printing, offset printing, screen-printing, etc. (We note that the printing of variable information is preferably reversely printed in the FIG. 12 implementation, since the print is provided on an inner surface of the laminate layers 116a and/or 116b. Thus, the printed information appears correctly aligned when viewed from the "view angle" shown in FIG. 12.).

The over-laminates 116a and 116b can be secured to the H1 structure through, e.g., lamination. One lamination techniques is a platen press, which receives the H1 structure and over-laminates 116a and 116b. The platen press includes upper and lower plates (e.g., Teflon coated metal or glass plates), which press (e.g., about 2.5K PSI) the H1 structure and over-laminates 116a and 116b with heat (e.g., up to about 275° F.) to form the H2 structure (i.e., without the spacing as illustrated). The lamination time varies between about 3–15 minutes, with an optimal lamination of about 10 minutes. Of course, other lamination techniques (e.g., rollers, press, pads, etc.) can be used to secure the over-laminates 116a and 116b to the H1 structure. The laminated structure H2 is cut (e.g., die cut) to yield multi-contactless smart identification documents. Each of these contactless smart identification document can be programmed as needed (e.g., the on-board chip 102 can be programmed to include personalized information such as pass codes, biometric information, identification information, information corresponding to the cardholder or to information printed on the identification document, etc.).

While specific structures have been discussed with respect to FIGS. 6–12, we note that many other implementations will fall within the scope of the present invention. For example, additional layers (e.g., laminate layers or print layers) can be added to the illustrated structures. Also, in a few cases, we use a structure including a contact layer/carrier/contact layer structure, or a laminate/contact layer/carrier/contact layer structure. In another implementation, we provide a cavity in an identification document, and then secure a contactless smart card module in the cavity.

And while we have described certain materials and dimensions for our contactless smart identification documents the present invention should not be limited to such. Indeed, the present invention includes many more contactless smart identification documents of different dimensions and materials.

Inventive Combinations

In addition to the inventive aspects detailed above and in the claims, some of the inventive combinations with respect to (e.g., contactless) smart ID documents include the following:

A. A method of manufacturing a contactless smart card comprising the steps of:
  providing a first contact layer and a second contact layer, the first contact layer comprising a front surface and a back surface, and the second contact layer comprising a front surface and a back surface;
  providing an adhesive adjacently with at least the back surface of the first contact layer;
  providing an adhesive adjacently with at least the back surface of the second contact layer;
  providing a carrier having a top surface and a bottom surface;
  combining the first contact layer, second contact layer and carrier to form a multi-layered structure, wherein the carrier comprises an antenna and electronic circuitry therein.

A1. The method of combination A, wherein the carrier comprises scrim and the electronic circuitry provides at least some smart card functionality.

A2. The method of combination A1, further comprising the steps of:
  coating at least the front surface of the first layer; and
  coating at least the front surface of the second layer.

A3. The method of combination A2, wherein the coating comprises polyurethane, and the first and second layers each comprises polycarbonate.

A4. The method of combination A3, further comprising the step of laminating a top laminate and a bottom laminate respectively so as to be in contact with the front surface of the first contact layer and the front surface of the second contact layer.

A5. The method of combination A1, further comprising the step of printing at least the first contact layer prior to said combining step.

A6. The method of combination A1, further comprising providing a laminate over at least the first contact layer, wherein the laminate comprises personalized information thereon, the information being document-holder specific.

B. A method of producing smart cards or identification documents comprising the steps of:
providing a scrim core comprising electrical circuitry and an antenna; and
providing the scrim core between a first layer and a second layer so that the first layer and second layer migrate into or through the scrim layer.

B1. The method of combination B, wherein the first layer and second layer each comprise polycarbonate.

B2. The method of claim B1, wherein the first layer contacts a core top side and the second layer contacts a core bottom side, wherein the top side layer is coated with a first polyurethane material and the bottom side second material is coated with a second polyurethane material.

B3. The method of any one of claims B, B1 and B2, wherein the electrical circuitry operates to provide at least some smart card functionality.

B4. The method of claim B3, wherein the at least some smart card functionality comprises at least one of data carrier, data manipulation, access control, identification verification, biometric carrier and data processing.

C. A smart identification document manufactured by the method in any one of claims A–A6 and B–B4.

D. A method of making a contactless smart identification document comprising:
providing a carrier layer including at least a transceiver and electronic circuitry, wherein the carrier comprises at least one permeable area;
arranging the carrier layer between a first contact layer and a second contact layer, and then securing the first contact layer and second contact layer to the carrier layer through at least one of heat and pressure so that at least a portion of one of the first contact layer and the second contact layer migrates into the carrier layer at the one permeable area; and
providing a first laminate layer over at least the first contact layer.

D1. The method of combination D, wherein indicia is provided on at least one of the first contact layer and the first laminate layer prior to said providing a first laminate layer step.

D2. The method of combination D1 further comprising providing a second laminate layer over the second contact layer.

D3. The method of combination D1 wherein the first contact layer and the first laminate layer each comprise a polymer.

D4. The method of combination D3, wherein the first contact layer comprises an adhesive/polymer/adhesive structure.

D5. The method of combination D4 wherein the second contact layer comprises an adhesive/polymer/adhesive structure.

D6. The method of combination D3, wherein the first laminate comprises a polymer/adhesive structure.

D7. The method according to any one of combinations D3–D6, wherein the polymer comprises polycarbonate.

D8. The method according to combination D7 wherein the adhesive comprises polyurethane.

E. A contactless smart identification document comprising:
a first contact layer;
a second contact layer;
a carrier layer sandwiched in between the first and second contact layers, the carrier layer including at least a transceiver and electronic circuitry;
wherein at least a portion of the first contact layer and the second contact layer have migrated into the carrier layer, the migration helping to secure at least a portion of the transceiver or electronic circuitry to the first and second contact layers; and
a first laminate layer covering the first contact layer and a second laminate layer covering the second contact layer.

E1. The contactless smart identification document of combination E wherein the carrier comprises at least one of a scrim and mesh.

F. A method of manufacturing a contactless smart card comprising the steps of:
providing a first layer and a second layer, the first layer comprising a front surface and a back surface, and the second layer comprising a front surface and a back surface;
coating at least the back surface of the first layer with an adhesive;
coating at least the back surface of the second layer with an adhesive;
providing a core having a top surface and a bottom surface;
combining the first layer, second layer and core to form a core structure, the core structure comprising the coated back surface of the first layer in contact with the top surface of the core and the coated back surface of the second layer in contact with the bottom surface of the core, wherein the core comprises an antenna and electronic circuitry contained therein.

G. A method of producing smart identification documents comprising the steps of:
providing a scrim core comprising electrical circuitry and an antenna; and
providing the scrim core between a first layer and a second layer.

Section 3: Manufacture of PET-Based Identification Document

The following section focuses primarily on identification documents. In particular, we present an incredibly earth-friendly and easily recycle-able identification document at a relatively low cost-per card. In one implementation, we provide an identification document structure including PET (polyethylene terephthalate) materials. PET material also has good strength and flexibility (with a low cracking tendency) and high anti-abrasion properties—while also providing advantageous cost efficiencies.

We envision that in some implementations of the present invention, our inventive a PET-base identification documents will be used in an over-the-counter (OTC) issuing model. As discussed in the background section above, over-the-counter ("OTC") identification documents are generally issued immediately to a bearer who is present at a document-issuing station. An OTC assembling process provides an ID document "on-the-spot". (An illustrative example of an OTC assembling process is a Department of Motor Vehicles ("DMV") setting where a driver's license is issued to a person, on the spot, after a successful exam.). In some instances, the very nature of the OTC assembling process results in small, sometimes compact, printing and card assemblers for printing the ID document. Of course, our inventive PET identification documents can be used in a central issue (CI) model as well.

Figure 13:
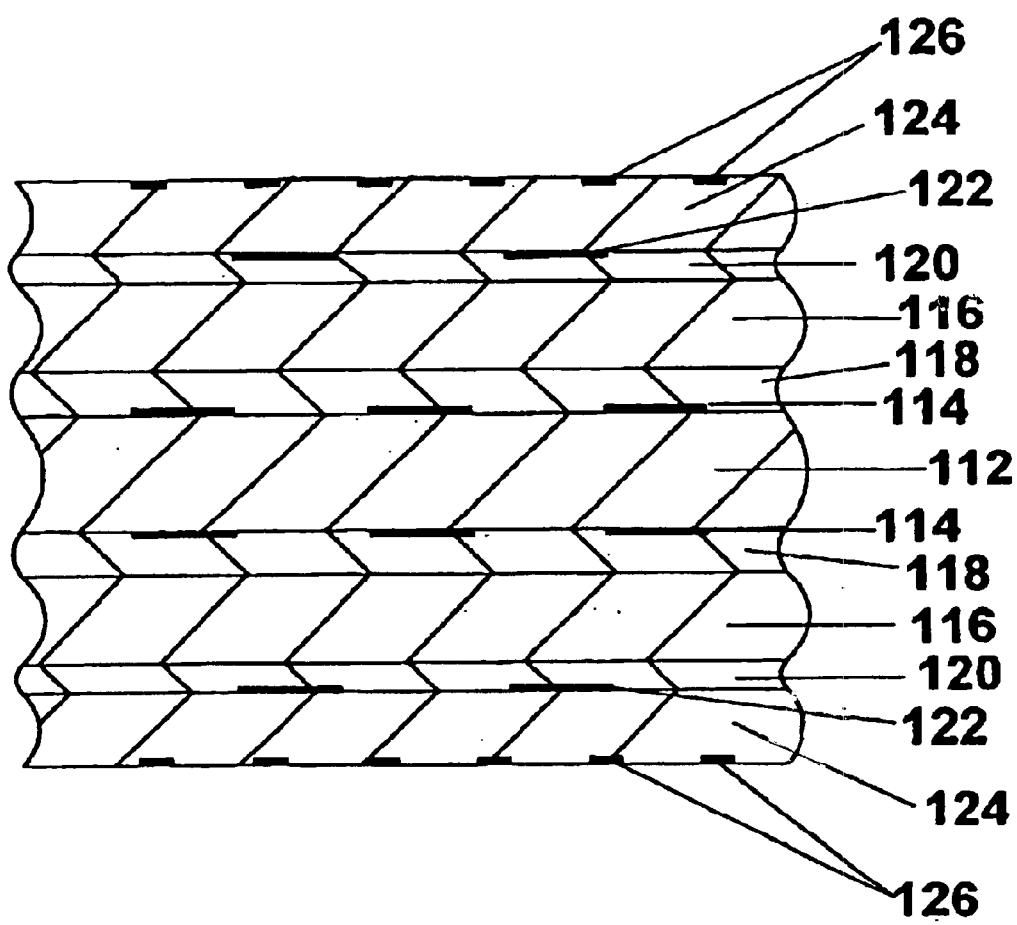
FIG. 13 is a cross-sectional view of a finished over-the-counter identification document (conventional art).

One example of an OTC identification document (as disclosed in our U.S. Pat. No. 6,066,594, and which is herein incorporated by reference) is shown in FIG. 13. FIG. 13 shows a schematic cross-section through an over-the-counter identification document (card). The document comprises a core layer 112 formed of an opaque white reflective polyolefin (e.g., a TESLIN sheet) and printed on both surfaces with fixed indicia 114.

The printed core layer 112 is sandwiched between two polymer layers 116 formed from an amorphous or biaxially oriented polyester or other optically clear plastic such as polycarbonate. Each of these polymer layers 116 is fixedly secured to the core layer 112 by a layer 118 of adhesive. On the opposed side of each polymer layer 116 from the core 112 is provided an image-receiving layer 120 suited to the acceptance of printed image or portrait or other variable indicia (indicated schematically at 122) by dye diffusion thermal transfer methods. The material used to form the image-receiving layers 120 is chosen so as to be immiscible with the polymer system of the donor sheet used, in accordance with U.S. Pat. No. 5,334,573 (which is herein incorporated by reference).

Figure 14:
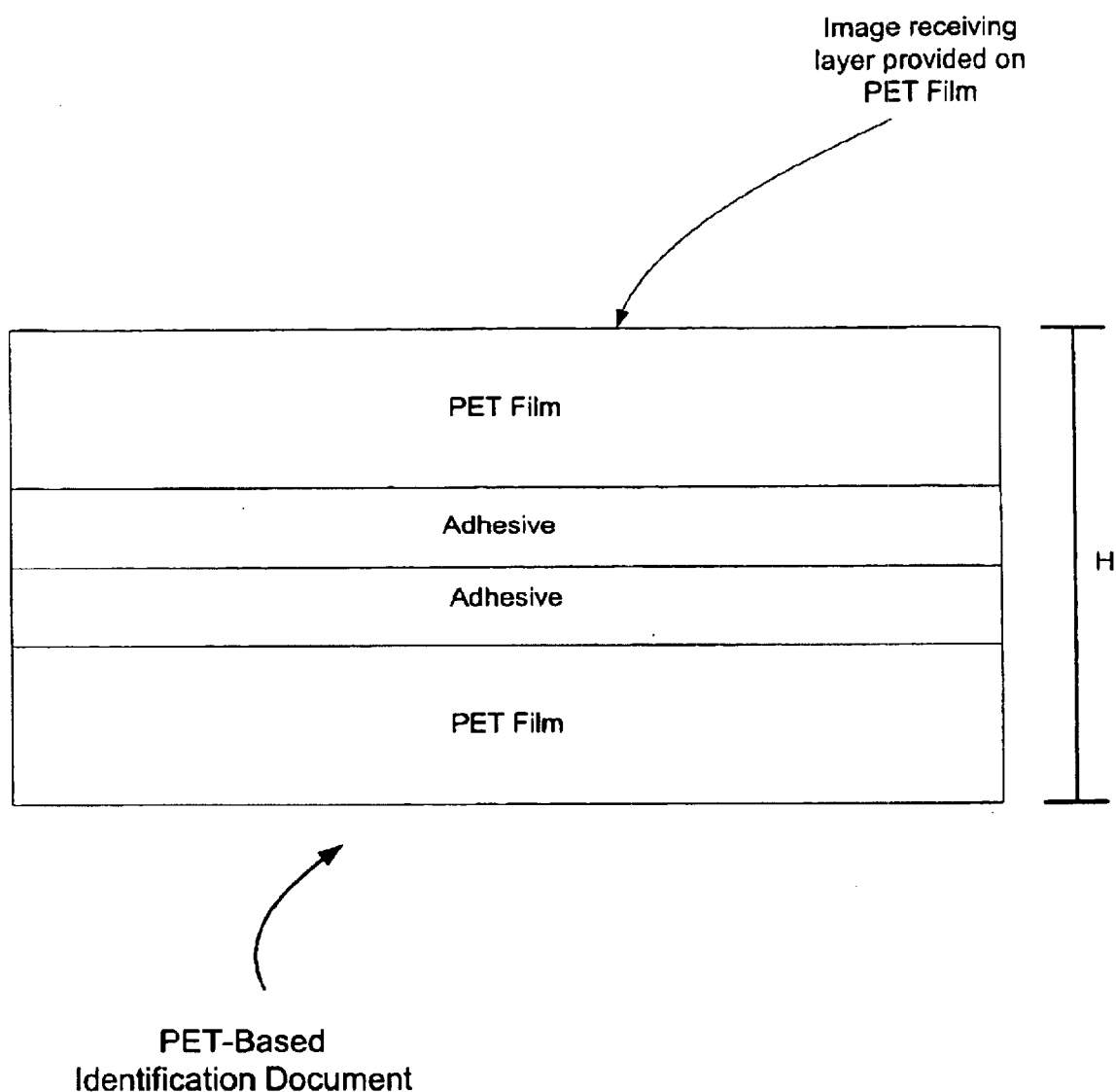
FIG. 14 is a cross-sectional view of a PET-based identification document according to one implementation.

With reference to FIG. 14, we present an inventive over-the-counter identification document including PET materials. In contrast to the FIG. 13 document, the FIG. 14 implementation is a coreless structure. The document primarily includes two PET layers (or films). Transilwrap, of Franklin Park, Ill., provides a suitable polyethylene terephthalate (PET) film under the trade name "TXP." In some implementations we provide an amorphous PET film or layer. Of course, there are many other PET films that can be suitably interchanged with this aspect of present invention. The two PET layers are combined, e.g., through a conventional lamination process. As shown in FIG. 12 we can use adhesive layers (e.g., thermoplastic adhesives—preferably PET-based adhesives) to help secure the PET layers. The adhesive layers can be coated or layered with the PET layers. A resulting structure PET structure is cut into required identification document sized cards, if needed. (We note that the document's height H can be adjusted according to required identification document specifications. For example, the PET layers are preferably between about 5–15 mils and the adhesive layers are preferably between about 2–10 mils. One implementation comprises 10 mil PET layers (e.g., Transilwrap's TXP white PET film) and 5 mil adhesive layers (e.g., Transilwrap's KRTY (polyolefin)).

The outer surface of a PET layer preferably receives information or indicia provided thereon. The PET layer can include coloration, e.g., white to even better accentuate the indicia. The information can include, e.g., variable information such as a cardholder's name, address, photograph, signature, biometric information, etc. and/or fixed information (e.g., information which is common to a number of cards, such as the issuing authority, security features, etc.). The printing may also include a so-called digital watermark. The watermark may be embedded in a background tint or pattern, a graphic or photograph, etc. A watermark can also be embedded through text or font manipulation as well. While we preferably transfer information to the PET layer through a dye diffusion thermal transfer—or "D2T2"—process, the PET layer can also be offset printed, ink or laser jet printed, laser etched, etc. We provide information on an outer surface of both PET layers in some implementations. We can also print information in stages. For example, we can pre-print fixed information on a PET layer or PET substrate prior to lamination (or after lamination) and before a second stage printing of variable information. The information can also include a registration or calibration marker to help align the identification document in subsequent printing steps.

The PET layer can be can be adapted to even better receive printed information. For example, we can provide a receiving-layer or "image receiving-layer" on an outer surface of a PET film. The term "image" in this disclosure should be understood to include all forms of printed and transferred information including images, graphics, text, machine readable code, and/or designs, etc., etc. The image-receiving layer (e.g., about a 2–20 micron layer) may be formed from any material capable of receiving an image, e.g., by dye diffusion thermal transfer. (In some cases we use Transilwrap's DITX receiving fluid as an image-receiving layer. In other cases, a polymer (e.g., PVC) is used to form an image-receiving layer is first dissolved in an organic solvent, such as methyl ethyl ketone, dichloromethane or chloroform, and the resultant solution is coated onto the PET layer using conventional coating apparatus, and the solvent is then evaporated to form the image-receiving layer. However, if desired, the receiving layer can be applied to the PET layer by extrusion casting, or by slot, gravure or other known coating methods. Of course, other materials and receiving layers, e.g., such as those disclosed in U.S. Pat. Nos. 5,334,573 and 6,066,594, may be suitable interchanged with this image-receiving aspect of the present invention.

It may be advantageous to coat the image-receiving material at a centralized production facility and then provide resultant "blank" documents to a plurality of document issue stations (OTC stations) at which variable data is applied to the image-receiving layers of the identification documents.

Following the printing of information on an image-receiving layer (if provided, otherwise after printing on the PET layer), a protective layer (not shown) is optionally affixed over at least a portion of the image-receiving layer. The protective layer serves to protect the relatively fragile image-receiving layer from damage, and also prevents bleeding of information (e.g., thermal transfer dye) from the image-receiving layer. Materials suitable for forming such protective layers are known to those skilled in the art of dye diffusion thermal transfer printing and any of the conventional materials may be used provided that they have sufficient transparency and sufficient adhesion to the specific image-receiving layer with which they are in contact and/or block bleeding of dye from this layer. However, in keeping with the theme of this aspect of the present invention, we preferably apply a transparent PET-based protective laminate, if used.

The protective layer may optionally provide additional security and/or features for the identification document. For example, the protective layer may include a low cohesivity polymeric layer, an optically variable ink, variable information, an image printed in an ink which is readable in the infra-red or ultraviolet but is invisible in normal white light, an image printed in a fluorescent or phosphorescent ink, cohesive failure ink, or any other available security feature which protects the document against tampering or counterfeiting, and which does not compromise the ability of the protective layer to protect the identification document against wear and the elements.

Figure 15:
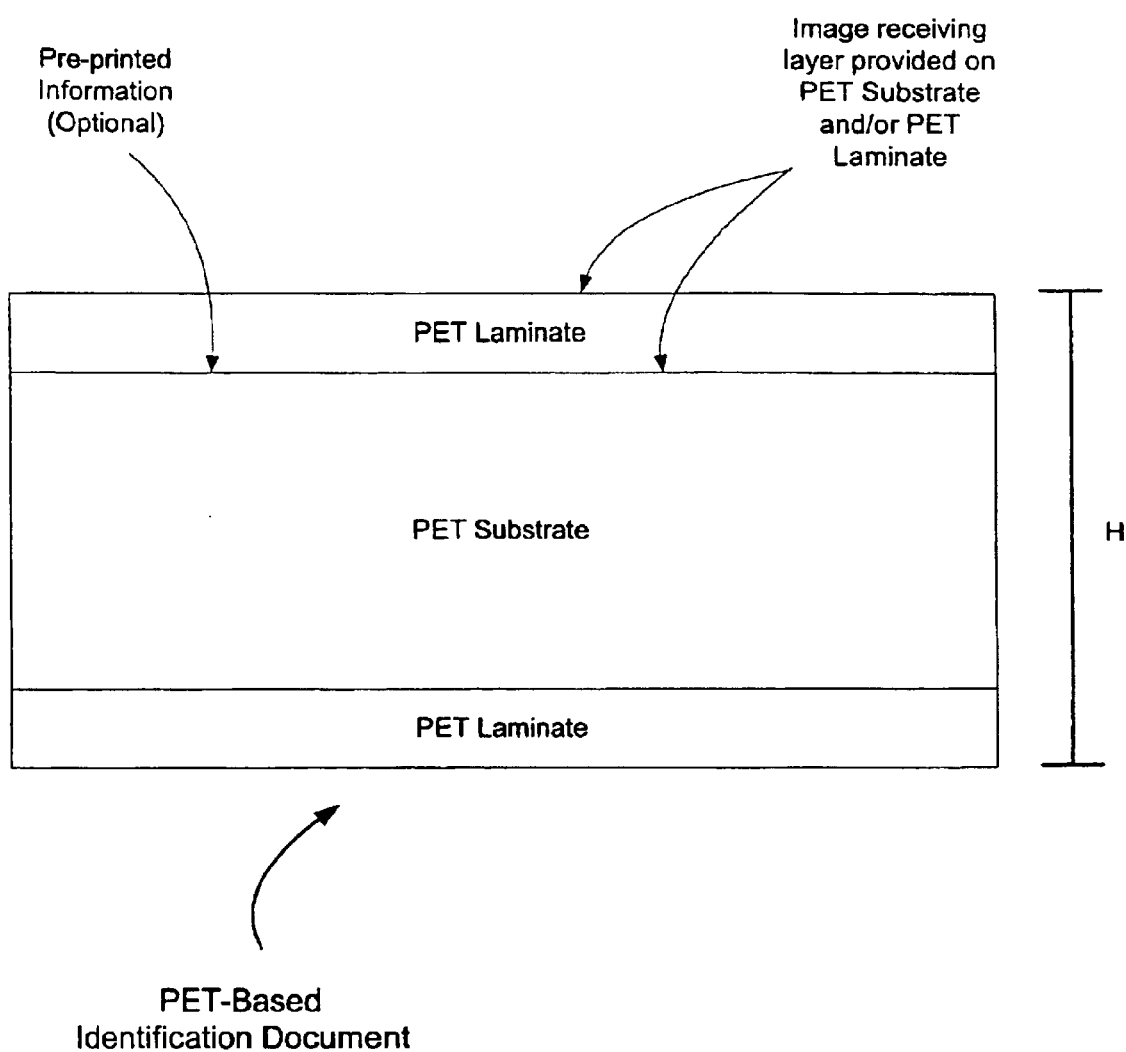
FIG. 15 is cross-sectional view of another PET-based document according to still another implementation.

With reference to FIG. 15 we provide yet another alternative implementation of a PET-based identification document. In particular, we provide a PET substrate, protected by PET protective laminates. Of course we can use adhesives to help secure the PET laminates to the PET substrate. The PET substrate is preferably colored, e.g., a white opaque color. Prior to lamination we provide information (e.g., variable and/or fixed information) on an outer surface or surfaces of the PET substrate. The PET substrate (or PET laminate) can be coated, prior to lamination, with an image-receiving material as discussed above. The image-receiving material can be provided between the PET laminate and PET substrate (e.g., on either or both of these layers). The image-receiving material can be alternatively (or in addition to) provided on an outer surface of the PET laminate layer. If information is provided on an outer-surface of a PET laminate, a thin film protective coat or layer can be optionally provided over the information for enhanced protection. A completed structure can be sized according to need (e.g., height H). Our structure, however, preferably includes dimensions in the following ranges: PET substrate (5–25 mils); PET laminates (2–15 mils) and adhesive layers, if used (2–8 mils).

From the foregoing, it will be seen that our PET-based identification documents provides an over-the-counter identification document that affords significant improvements in durability (e.g., flexibility and crack-resistance) and earth-friendly characteristics (e.g., recycle and low-hazardous emissions during production) as compared with the other OTC identification documents. These types of PET-based ID documents can also be provided at a significantly lower cost than other OTC (and CI) documents. Our PET-based identification documents can also provide a durable and secure identification document that is instantly produced over-the-counter. It should be appreciated that our PET-base identification document can also include so-called "blanks," or document structures without printing, or with printing but prior to personalizing the document.

While we prefer that our PET identification documents include all PET materials, it should be appreciated that our inventive PET-based ID documents need not be limited as necessarily including all PET. For example, a polymer (but non-PET) over-laminate may be added, a non-PET adhesive may be used, a non-PET image receiving layer is employed, etc. And of course the dyes or inks and other security features will not generally be PET-based. Such deviations certainly fall within the scope of this aspect of the present invention.

Inventive Combinations

In addition to the inventive aspects detailed above and in the claims, some of the inventive combinations with respect to PET-based ID documents include the following:

A. A coreless identification document comprising:

a first PET (polyethylene terephthalate) film including a top surface and a bottom surface;

a second PET film including a top surface and a bottom surface;

an image-receiving layer provided on the first PET film top surface; and an adhesive layer in contact with the first PET film bottom surface and the second PET film top surface, the adhesive serving to secure the first PET film and the second PET film to one another.

A1. The document of combination A, wherein the receiving layer comprises a layer capable of being imaged by dye diffusion thermal transfer.

A2. The document of combination A wherein the image-receiving layer comprises a layer capable of being imaged by gravure printing.

A3. The document of combination A, wherein the image-receiving layer comprises a depth in a range of 2 to 15 microns.

A4. The document of combination A, wherein the first PET film and the second PET film each comprises a depth of about 10 mils.

A5. The document of combination A, wherein the adhesive layer comprises at least two adhesive layers.

A6. The document of combination A, wherein the adhesive comprises PET.

A7. The document of combination A, wherein indicia is provided on the image-receiving layer.

A8. The document of combination A7, wherein a laminate layer is provided over the indicia on the image-receiving layer.

A9. The document of combination A7, wherein the indicia is provided through dye diffusion thermal transfer (D2T2).

A10. The document of combination A7, wherein the indicia is provided through gravure printing.

A11. The document of combination A, further comprising a second image-receiving layer provided on the second PET film top surface.

A12. The document of combination A11, wherein indicia is provided on the second image-receiving layer.

A13. The document of combination A12, wherein a laminate layer is provided over the indicia on the second image-receiving layer.

A14. The document of any one of combinations A7 and A13, wherein the indicia comprises at least one of a digital watermark and information that is specific to one who will bear the document.

A15. The document of combination A, wherein each of the first and second PET layers comprises white coloration.

A16. The document of combination A15, wherein each of the first and second PET layers comprises substantially amorphous PET.

B. An identification document comprising:

a PET (polyethylene terephthalate) core layer comprising a first surface and a second surface, a first layer of a substantially transparent PET fixed to the first surface of the PET core layer;

a second layer of a substantially transparent PET fixed to the second surface of the PET core layer; and at least one image-receiving layer capable of being receiving information, the image-receiving layer being fixed to at least one of the first transparent PET layer and the first surface of the PET core layer.

B1. The document of combination B, wherein the receiving layer comprises a layer capable of being imaged by dye diffusion thermal transfer.

B2. The document of combination B wherein the image-receiving layer comprises a layer capable of being imaged by gravure printing.

C. An identification document comprising:

a first PET (polyethylene terephthalate) film including a top surface and a bottom surface;

a second PET film including a top surface and a bottom surface; and an adhesive layer in contact with the first PET film bottom surface and the second PET film top surface, the adhesive serving to secure the first PET film and the second PET film to one another.

D. A method of making an identification document comprising the steps of:

providing a first PET (polyethylene terephthalate) film including a top surface and a bottom surface;

providing a second PET film including a top surface and a bottom surface;

providing an image-receiving layer adjacently arranged on the first PET film top surface; and providing an adhesive layer so as to be in contact with the first PET film bottom surface and the second PET film top surface, the adhesive serving to secure the first PET film to the second PET film.

D. A method of making an identification document comprising the steps of:

providing a PET (polyethylene terephthalate) core layer comprising a first surface and a second surface, providing a first layer of a substantially transparent PET so as to be adjacently arranged with the first surface of the PET core layer;

providing a second layer of a substantially transparent PET so as to be adjacently arranged with the second surface of the PET core layer; and providing at least one image-receiving layer capable of being receiving information, the image-receiving layer being adjacently arranged with at least one of the first transparent PET layer and the first surface of the PET core layer.

Conclusion

Having described and illustrated the principles of the technology with reference to specific implementations, it will be recognized that the technology can be implemented in many other, different, forms.

For example, while we have described a contact-type smart card module as including, e.g., a Hitachi AE 45C module, the present invention is not so limited. Indeed many other smart card modules are contemplated, e.g., Atmel's 1608, ModuleEight, and products from Philips, EVM, etc., etc. Of course other modules can be used to facilitate similar/additional smart card functionality. A cavity can be formed to accommodate the various shapes and dimensions of alternative smart card modules.

In at least one embodiment (not shown), laminate layers are formed into a pouch into which the core layer slips. With a pouch, methods such as heat, pressure, adhesives, and the like, are usable to bond the core layer to the pouch laminates. Those skilled in the art will appreciate that many known structures and configurations for laminating are usable with the invention.

While we use terms herein like "front"and "back," these terms are provided primarily for the reader's convenience. For example, a smart card module can be provided on a "front" side, instead of a "back" side as discussed in section 1.

The technology disclosed herein can be used in combination with other technologies. Examples include the technology detailed in the following applications, the disclosures of which are incorporated herein by reference: Ser. No. 09/747,735 (filed Dec. 22, 2000); Ser. No. 09/969,200 (filed Oct. 2, 2001) and U.S. Provisional Application No. 60/429,115 (filed Nov. 25, 2002). Also, instead of ID documents, the inventive techniques can be employed with product tags, product packaging, business cards, smart cards, bags, charts, maps, labels, etc., etc. The term ID document is broadly defined herein to include these tags, labels, packaging, cards, etc.

While many features and aspects of the present invention have been disclosed herein, it will be appreciated that not all aspects and features need be incorporated into each of the following claims.

To provide a comprehensive disclosure without unduly lengthening the specification, applicants herein incorporate by reference each of the patent documents referenced above.

The particular combinations of elements and features in the above-detailed embodiments are exemplary only; the interchanging and substitution of these teachings with other teachings in this and the incorporated-by-reference patent documents are also expressly contemplated.

The technology disclosed herein can be used in combination with other technologies. For example, instead of traditional smart cards, the inventive techniques can be employed with identification documents, drivers' licenses, passports, product tags, product packaging, business cards, bags, charts, maps, labels, etc. The terms "smart card" and "smart ID document" are broadly defined herein to include such licenses, passports, tags, labels, packaging, cards, etc.

It should be appreciated that while specific dimensions and components have been presented herein (including the drawings), the present invention is not limited to such dimensions and specific components. Indeed, many of the document dimensions, materials, printing techniques and smart card circuitry can be interchanged without deviating from the scope of the present invention.

In view of the wide variety of embodiments to which the principles and features discussed above can be applied, it should be apparent that the detailed embodiments are illustrative only and should not be taken as limiting the scope of the invention. Rather, we claim as our invention all such modifications as may come within the scope and spirit of the following claims and equivalents thereof.

What is claimed is:

1. A smart identification document comprising:

a core layer including a first surface and a second surface, the core layer comprising a first material:

a first layer of a substantially transparent polymer adjacently arranged on and fixedly attached to the first surface of the core layer to form a document structure having first and second surfaces, where the substantially transparent polymer of the first layer comprises a material that is substantially different than the first material an aperture formed into the document structure, the aperture being formed after the first layer and the core layer have been fixedly attached together, the aperture comprising:

a first section disposed in the first polymer layer, the first section including a ledge in the first polymer layer, and a second section disposed in at least the core layer; and a module including electronic circuitry, wherein at least a first portion of the module is adjacently arranged with the ledge, and at least a second portion of the module extend into at least some of the second section of the aperture.

2. The identification document of claim 1 wherein at least one of the first surface of the core layer, first surface of the document structure, second surface of the document structure, and the second surface of the core layer bears at least one printed indicia thereon.

3. The identification document of claim 1 further comprising an adhesive layer disposed between the ledge and the first portion of the smart card module.

4. The identification document of claim 1, wherein the second portion of the module that extends into the second section of the aperture floats in the second section.

5. The identification document of claim 1, wherein the second section comprises a floor, and wherein the second portion of the module that extends into the second section does not contact the floor.

6. The identification document of claim 1, wherein the document structure further comprises a second layer of a substantially transparent polymer adjacently arranged between and fixedly attached to the first layer of substantially transparent polymer and the first surface of the core and wherein the aperture further comprises a third section diseased in the second layer.

7. The identification document of claim 6, wherein the second layer of substantially transparent polymer comprises an adhesive.

8. The identification document of claim 7, wherein at least one of the first surface of the core layer and the adhesive comprises indicia thereon.

9. The identification document of claim 8, wherein the indicia included a photographic representation of a human subject.

10. The identification document of claim 1, wherein the core layer comprises at least one of a synthetic material, a polymer, a synthetic paper, a polyolefin, and a silica-filled polyolefin.

11. The identification document of claim 10, wherein the first layer of the substantially transparent polymer that is adjacently arranged on the first surface of the core layer comprises at least one of polyester, polystyrene, cellulose ester, polyolefin, polysulfone, polyamide, amorphous polyester, biaxially oriented polyester and polycarbonate.

12. The identification document of claim 1, wherein the core layer comprises TESLIN.

13. The identification document of claim 1, wherein the first layer of the substantially transparent polymer that is adjacently arranged on the first surface of the core layer includes a front surface and a back surface, the front surface being the surface that is adjacently arranged on the first surface of the core layer, and wherein the smart card module comprises a contact pad which is approximately flush with the back surface.

14. The identification document of claim 1, wherein the aperture is formed so that at least a portion of the module substantially floats within at least one of the first and second sections of the aperture.

15. The method of claim 14 wherein the laminate layer document core sandwich structure further comprises an adhesive layer disposed between the laminate layer and the document core and wherein the lower cavity extends through the laminate layer and the adhesive layer into the document core.

16. The identification document of claim 1 wherein the module comprises a contact-type smart card module.

17. A method of milling a cavity in an identification document to receive a smart card module, the identification document comprising at least a laminate layer-document core sandwich structure, wherein the laminate layer comprises a substantially different material than does the document core, said method comprising:

providing a first cut in the laminate layer to create a rough upper cavity, the rough upper cavity including a first aperture;

providing second cut to create a lower cavity, the lower cavity extending through the laminate layer into the document core, the lower cavity and the rough upper cavity being approximately centered on a common axis, wherein the aperture of the lower cavity is relatively smaller than the aperture of the rough upper cavity resulting in a shelf in the laminate layer; and providing a third cut around the rough upper cavity to create a finished upper cavity, the finished upper cavity having an aperture, which is larger than the aperture of the rough upper cavity, the finished upper cavity being approximately centered on the common axis.

18. The method of claim 17, wherein the core comprises a synthetic and the laminate layer comprises a polymer.

19. The method of claim 17 further comprising providing the first second, and third cuts so that at least a portion of the smart card module to be received will substantially float within at least one of the upper and lower cavities.

20. A method of making a contactless smart identification document comprising:

providing a carrier layer including at least a transceiver and electronic circuitry, wherein the carrier comprises at least one permeable area;

arranging the carrier layer between a first contact layer and a second contact layer, and then securing the first contact layer and second contact layer to the carrier layer through at least one of heat and pressure so that at least a portion of one of the first contact layer and the second contact layer migrates into the carrier layer at the one permeable area; and providing a laminate layer over at least the first and second contact layers.

21. An identification document comprising:

a first PET (polyethylene terephthalate) film including a top surface and a bottom surface;

a second PET film including a top surface and a bottom surface;

an image-receiving layer provided on the first PET film top surface; and an adhesive layer in contact with the first PET film bottom surface and the second PET film top surface, the adhesive serving to secure the first PET film to the second PET film.

* * * * *